(12) United States Patent
Hara et al.

(10) Patent No.: US 6,318,707 B1
(45) Date of Patent: Nov. 20, 2001

(54) SEMICONDUCTOR INTEGRATED CIRCUIT DEVICE

(75) Inventors: Kota Hara; Hiroyoshi Tomita; Naoharu Shinozaki, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/536,467

(22) Filed: Mar. 28, 2000

(30) Foreign Application Priority Data

Jun. 25, 1999 (JP) ................................................ 11-180230

(51) Int. Cl.[7] ...................................................... G11C 8/00
(52) U.S. Cl. ............................................ 265/233; 365/194
(58) Field of Search ............................. 365/233, 189.05, 365/189.11, 194

(56) References Cited

U.S. PATENT DOCUMENTS

| | | | |
|---|---|---|---|
| 5,768,177 | * 6/1998 | Sakuragi | 365/194 |
| 5,835,444 | * 11/1998 | Kim et al. | 365/233 |
| 6,055,210 | * 4/2000 | Setogawa | 365/233 |
| 6,111,812 | * 8/2000 | Gans et al. | 365/233 |
| 6,125,064 | * 9/2000 | Kim et al. | 365/193 |

FOREIGN PATENT DOCUMENTS

| | | |
|---|---|---|
| 9-153279 | 6/1997 | (JP) . |
| 10-21684 | 1/1998 | (JP) . |

* cited by examiner

*Primary Examiner*—Richard Elms
*Assistant Examiner*—Anh Phung
(74) *Attorney, Agent, or Firm*—Arent Fox Kintner Plotkin & Kahn, PLLC

(57) ABSTRACT

A semiconductor integrated circuit device includes a clock buffer circuit receiving a clock signal, a data buffer circuit receiving a data signal, an output circuit outputting the data signal from the data buffer circuit in accordance with the clock signal from the clock buffer circuit, and an adjustment circuit adjusting timings of the clock signal and the data signals.

5 Claims, 28 Drawing Sheets

INPUT CODE

| Command | C5 | C4 | C3 | C2 | C1 | C0 |
|---|---|---|---|---|---|---|
| MRS(1) | | | | H | H | H |
| MRS(2) | | L | | H | L | H |
| MRS(3) | | L | | H | H | L |
| MRS(4) | H | H | L | | | |

US 6,318,707 B1

SEMICONDUCTOR INTEGRATED CIRCUIT DEVICE

BACKGROUND OF THE INVENTION

1. Field of the Invention

The present invention generally relates to semiconductor integrated circuit devices, and more particularly to a semiconductor integrated circuit device that operates in synchronism with an external clock signal applied thereto.

2. Description of the Related Art

Recently, semiconductor integrated circuit devices have been required to operate at higher frequencies. For example, memories are required to operate at higher speeds as CPU operates faster. For example, SDRAM (Synchronous Dynamic Random Access Memory) and DDR-SDRAM (Double Data Rate SDRAM) can operate at a high frequency in synchronism with an external clock signal applied therefrom. Such memories must be equipped with a high-speed, high-precision input circuit supplied with a clock signal and a data signal from the outside of the memories.

SUMMARY OF THE INVENTION

It is an object of the present invention to provide a semiconductor integrated circuit device equipped with a high-speed, high-precision input circuit supplied with a clock signal and a data signal.

A more specific object of the present invention is to provide a semiconductor integrated circuit device capable of adjusting deviations of the timings of the clock signal and the data signals.

The above objects of the present invention are achieved by a semiconductor integrated circuit device comprising: a clock buffer circuit receiving a clock signal; a data buffer circuit receiving a data signal; an output circuit outputting the data signal from the data buffer circuit in accordance with the clock signal from the clock buffer circuit; and an adjustment circuit adjusting timings of the clock signal and the data signals. Since the timings of the clock signal and the data signals can be adjusted, it is possible to realize a high-speed, high-precision input circuit.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

A description will be given of an input circuit of a semiconductor integrated circuit device related to the present invention in order to facilitate understanding of the present invention. By way of example, the following description is directed to an input circuit of a DDR-SDRAM capable of inputting and outputting data in synchronism with the rising and falling edges of the clock signal.

Figure 1:
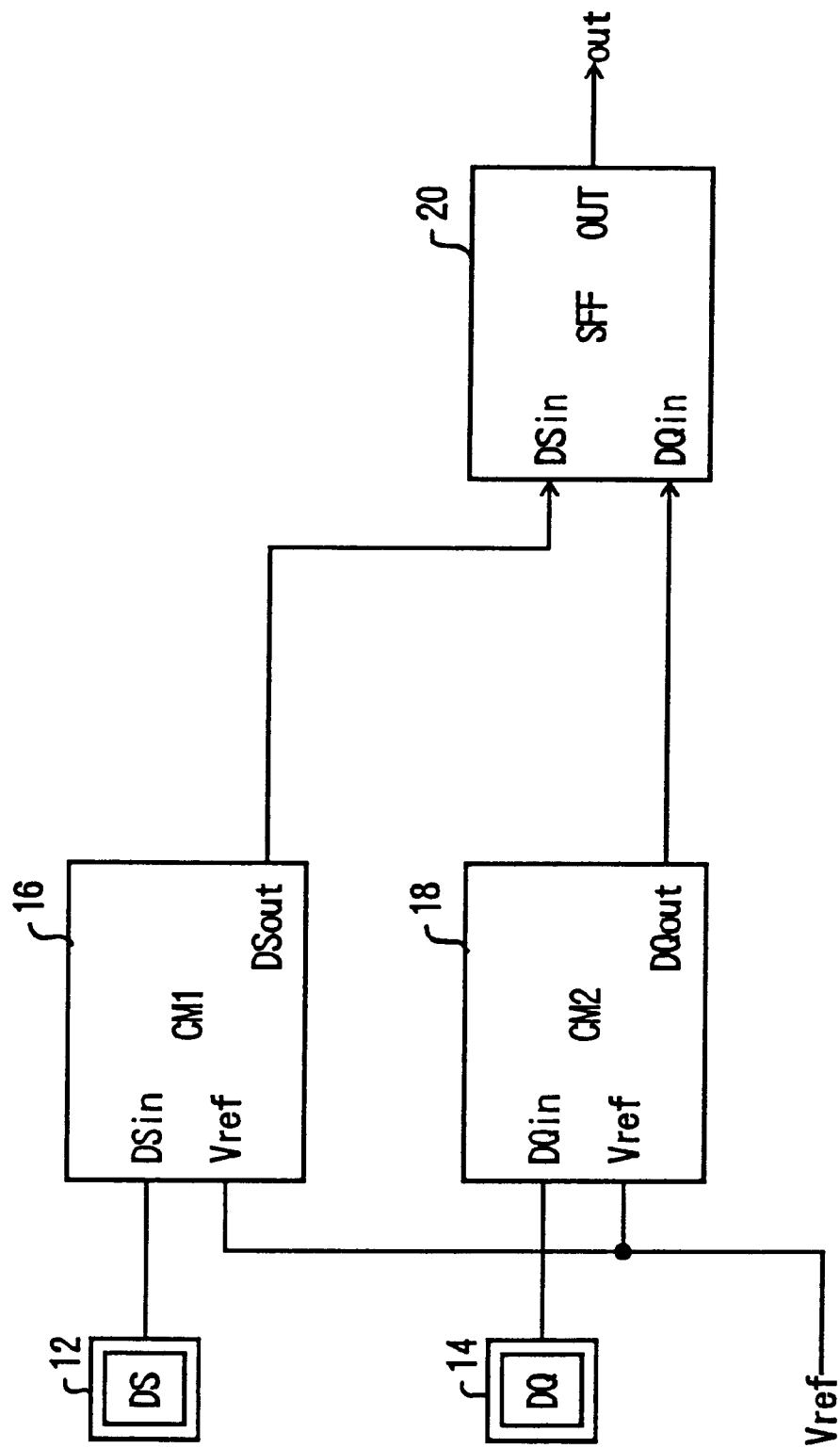
FIG. 1 is a block diagram of an input circuit built in a semiconductor integrated circuit device related to the present invention.

FIG. 1 shows such an input circuit. The input circuit shown in FIG. 1 includes chip pads 12 and 14, input buffer circuits 16 and 18, and a latch circuit 20 acting as an output circuit. The input buffer circuit 16 receives a clock signal of a given cycle via the chip pad 12. The input buffer circuit 18 receives a data signal via the chip pad 14 in synchronism with the clock signal. The input buffer circuit 16 amplifies the input clock signal, and supplies the amplified clock signal to the latch circuit 20. The input buffer circuit 18 amplifies the input data signal, and supplies the amplified data signal to the latch circuit 20. The latch circuit 20 latches the received data signal in synchronism with each edge of the clock signal.

An operation of the input circuit shown in FIG. 1 will be described with reference to FIG. 2, which shows a structure of the input circuit. The input circuit shown in FIG. 2 includes chip pads 22 and 24, input buffer circuits 26 and 28, and latch circuits 30 and 32 respectively acting as first and second output circuits. The input buffer circuit 28 receives a clock signal of a given cycle via the chip pad 24. The input buffer circuit 26 receives the data signal synchronism with the clock signal via the chip pad 22.

The input clock signal applied to the input buffer circuit 28 is delayed by two inverters a cascaded, and clock signals DS0 and DS180 are thus produced. The clock signal DS0 is produced by passing the input clock signal through only one of the two inverters. The clock signal DS0 is produced by passing the input clock signal through the two inverters. The clock signal DSO is supplied to the latch circuit 30, and the clock signal DS180 is supplied to the latch circuit 32. The input buffer circuit 26 amplifies the data signal received via the chip pad 22, and outputs the amplified data signal to the latch circuits 30 and 32.

The latch circuit 30 latches the data signal in synchronism with the rising edges of the clock signal DS0. The latch circuit 32 latches the data signal in synchronism with the rising edges of the clock signal DS180.

Figure 2:
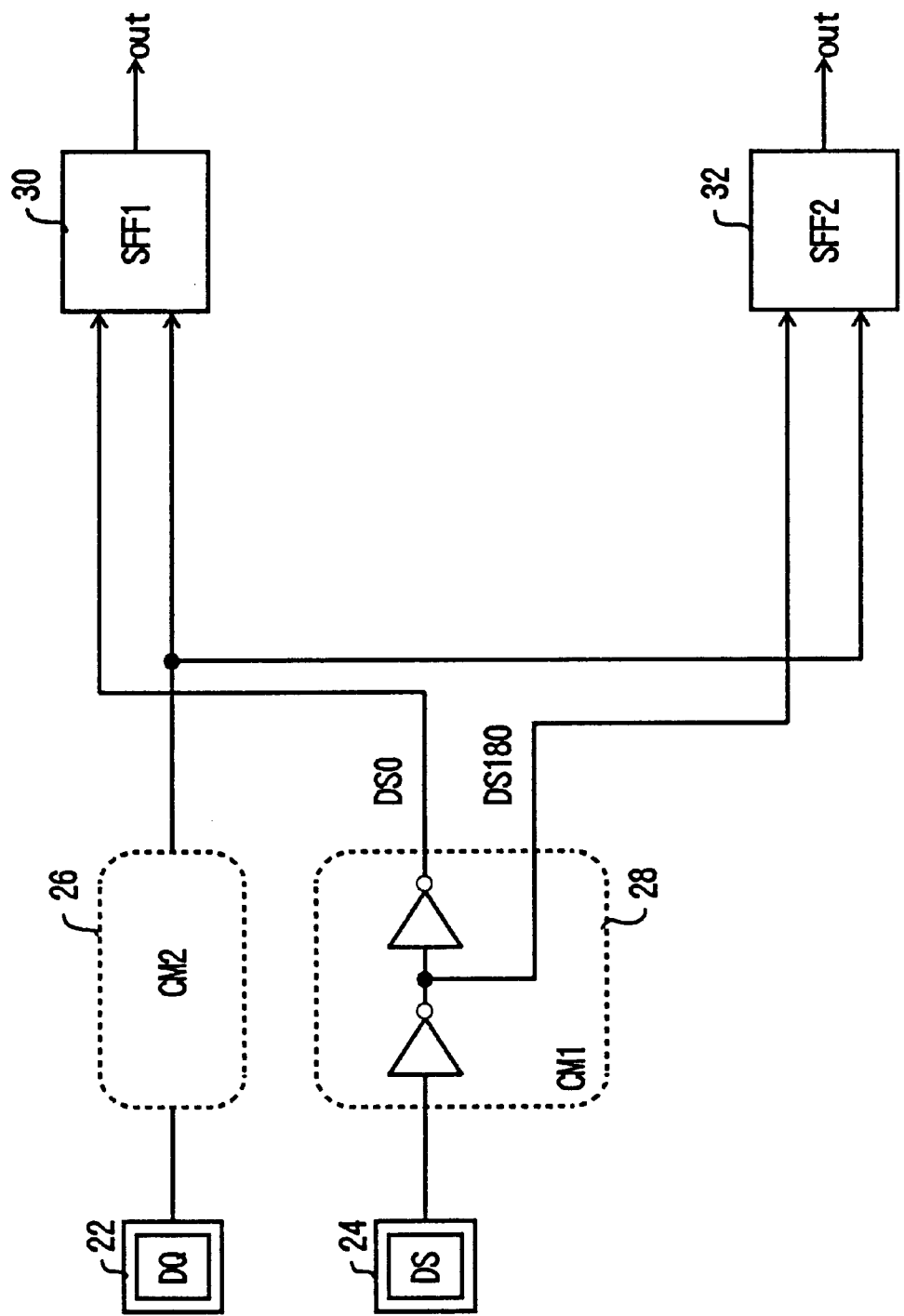
FIG. 2 is a block diagram of another input circuit related to the present invention.

The input circuits shown in FIGS. 1 and 2 are required to have a severer tolerable timing range when operating at a higher frequency. For example, the timing difference between the clock signal DSO and the clock signal DS180 affects the operations of circuits following the latch circuits 30 and 32, such as decoders made up of logic circuits. Further, an unevenness of the conditions for fabricating the semiconductor devices affects the tolerable timing range.

The present invention is directed to eliminating the above drawbacks of the related art.

A description will now be given of SDRAMs and DDR-SDRAMs according to embodiments of the present invention. It is to be noted that the present invention is not limited to SDRAMs and DDRSDRAMs but includes other types of semiconductor integrated circuit memories and devices.

Figure 3:
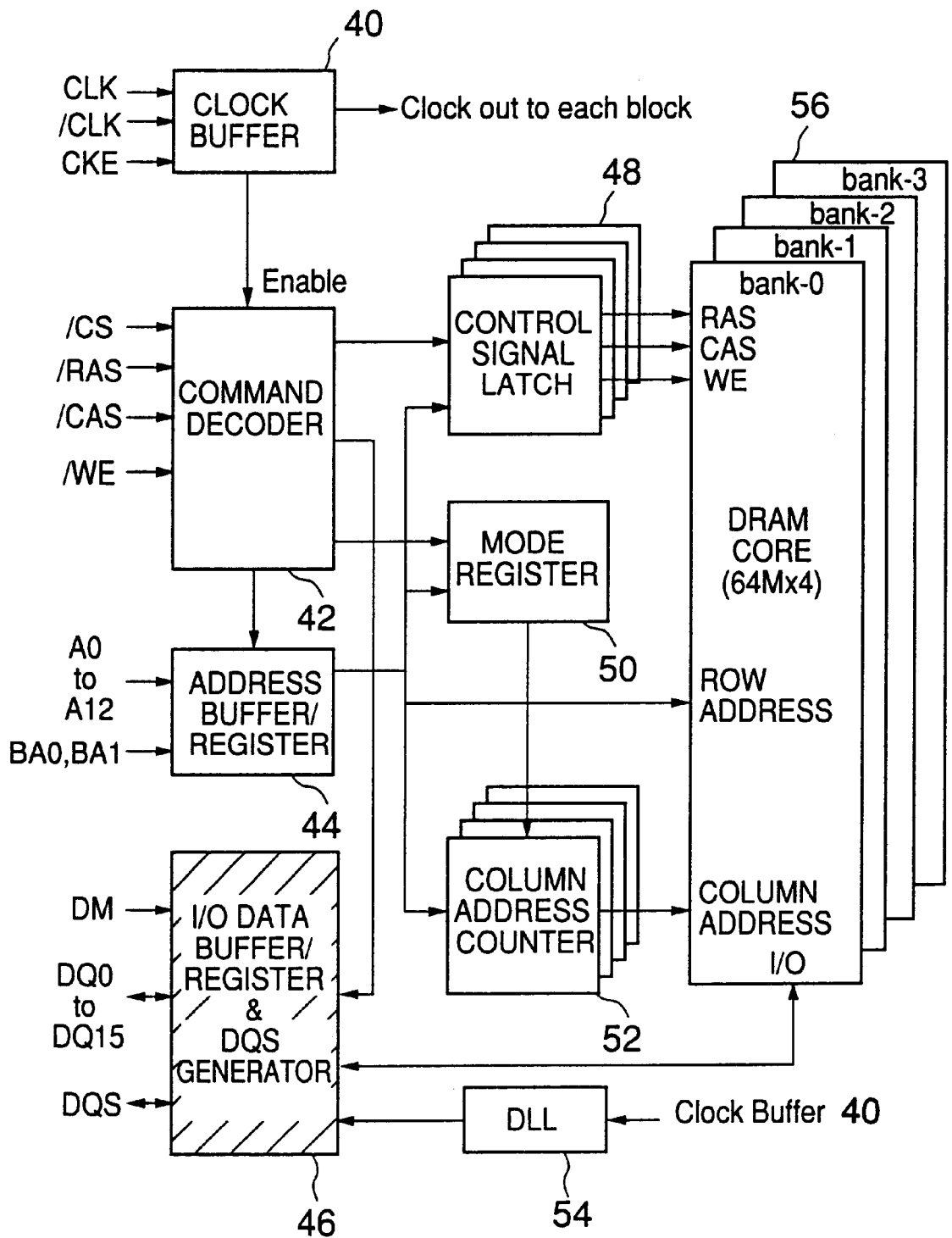
FIG. 3 is a block diagram of an overall structure of a semiconductor integrated circuit device of the present invention.

First, a description will now be given, with reference to FIG. 3, of an overall structure of the semiconductor integrated circuit memory of the present invention. The memory shown in FIG. 3 includes a clock buffer 40, a command decoder 42, an address buffer 44, a data input buffer circuit 46, a control signal latch circuit 48, a mode register 50, a DLL (Delay-Locked Loop) circuit 54, and a core a circuit 56.

The clock buffer 40 receives a clock signal CLK and a clock signal /CLK which is the inverted signal of the clock signal CLK. Also, the clock buffer 40 receives a clock enable signal CKE. The clock buffer 40 supplies buffered clock signals to internal blocks of the memory.

The command decoder 42 receives a chip select signal /CS, a row address strobe signal /RAS, a column address strobe signal /CAS, and a write enable signal /WE, and decodes a command defined by these signals. The decoded signal is then supplied to the control signal latch circuit 48 and the data input buffer circuit 46.

The address buffer 44 receives address signals A0–A12 from the outside of the memory, and outputs them to the control signal latch circuit 48, the mode register 50, the column address counter 52 and the core circuit 56. The data input buffer circuit 46 receives data signals DQ0–DQ15 from the outside of the memory, and outputs the data signals to the core circuit 56. Also, the data input buffer circuit 46 receives data signals from the core circuit 56, and outputs them to the outside of the memory as data signals DQ0–DQ15. The data input buffer circuit 46 operates in synchronism with a clock signal supplied from the DLL circuit 54.

The core circuit 56 includes a plurality of banks (bank-0–bank-3), each including a cell matrix and its peripheral circuits. Each of the banks receives an internal row address strobe signal RAS, an internal column address strobe signal CAS, and a write enable signal WE from a respective block of the control signal latch circuit 48, and receives a row address supplied from the address buffer 44, and a column address supplied from a respective block of the column address counter 52. In accordance with the above signals applied to the core circuit 56, the core circuit 56 performs a data read/write operation. The mode register 50 stores burst length information, which is supplied to the column address counter 52.

The present invention has an improved input circuit provided in the data input buffer circuit 46, which will now be described in detail.

The input circuit in the data input buffer 46 has a first function of adjusting the timings of signals resulting from a factor related to the process of fabricating the semiconductor devices, and/or a second function of adjusting the timings of signals resulting from a difference in circuit configuration. First, the first function will be described.

Figure 4:
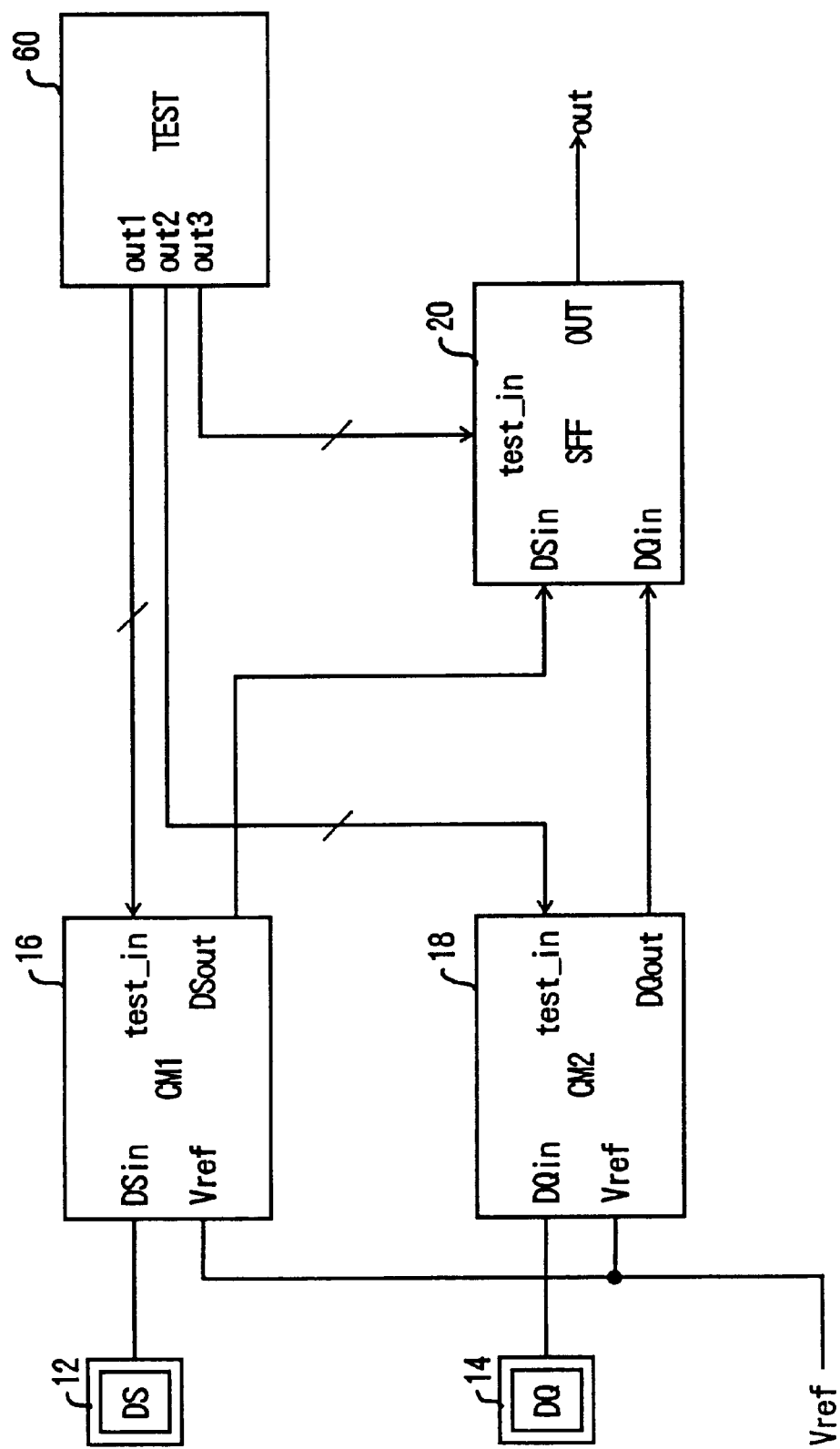
FIG. 4 is a block diagram of a first embodiment of an input circuit provided in the semiconductor device of the present invention.

FIG. 4 is a block diagram of a first embodiment of the input circuit included in the data input buffer 46. The input circuit shown in FIG. 4 includes a test circuit 60, which is not used in the configuration shown in FIG. 1. The test circuit 60 supplies a test signal to the input buffer circuits 16 and 18, and the latch circuit 20, and deviations of the timings of the clock signal and the data signals in accordance with a sequence which will be described later.

Figure 5:
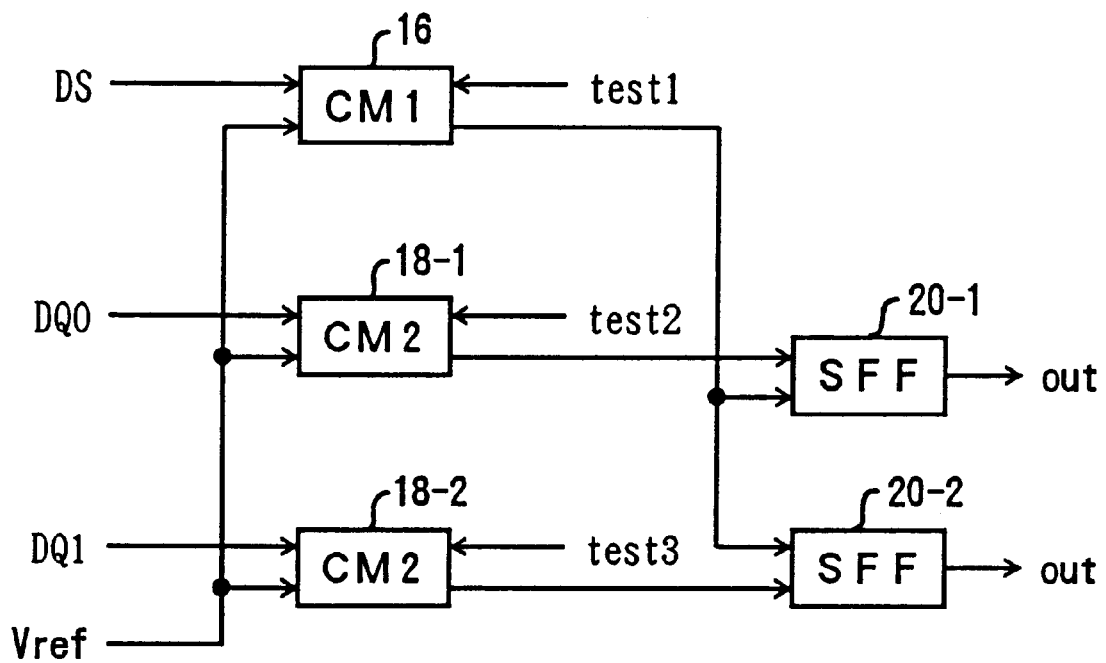
FIG. 5 is a block diagram showing routes through which test signals are supplied.
Figure 6:
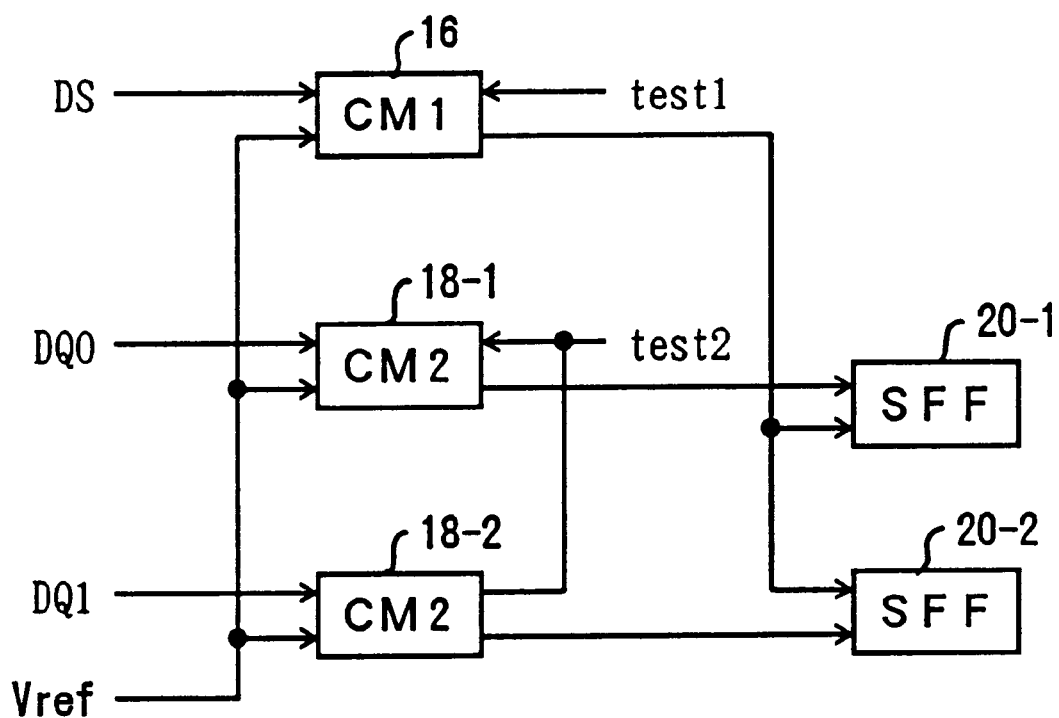
FIG. 6 is a block diagram showing alternative routes through which the test signals are supplied.

The configuration shown in FIG. 4 includes only one input buffer circuit that receives the data signal, that is, the input buffer circuit 18. However, as shown in FIG. 5, there is another configuration in which a plurality of input buffer circuits 18-1 and 18-2 that receive the respective data signals are employed. In such a configuration, each of the input buffer circuits 18-1 and 18-2 may be supplied with the respective different test signal, as shown in FIG. 5. Alternatively, the input buffer circuits 18-1 and 18-2 are supplied with the common test signal, as shown in FIG. 6.

Figure 7:
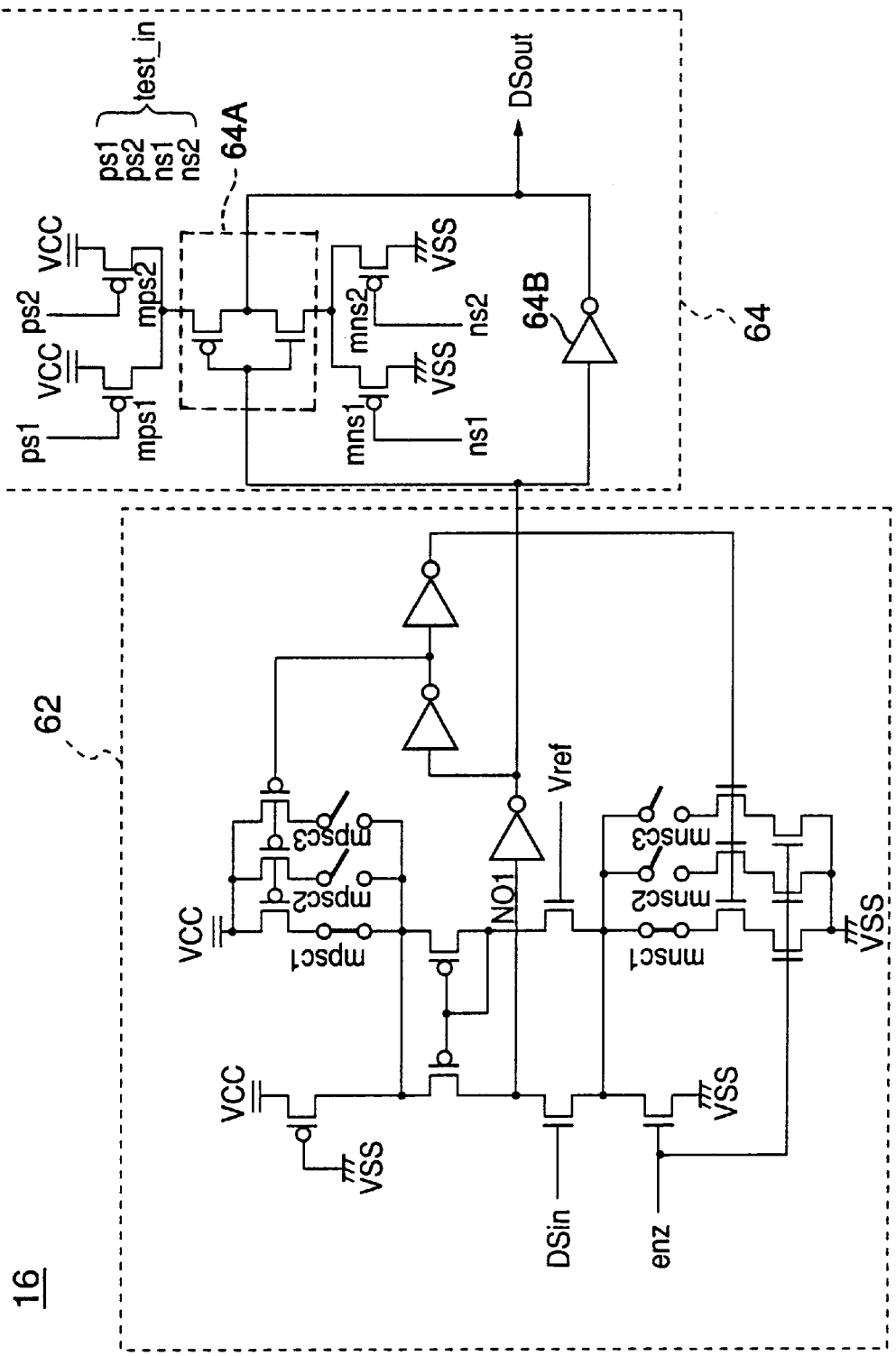
FIG. 7 is a circuit diagram of a first embodiment of an input buffer circuit.

A description will now be given, with a reference to FIG. 7, of the input buffer circuit 16. FIG. 7 shows a configuration of the input buffer circuit 16. The input buffer circuit 18 has the same configuration as the input buffer circuit 16.

Referring to FIG. 7, the input buffer circuit 16 includes a front stage 62 and a rear stage 64. The front stage 62 includes a current-mirror circuit, and switches mpsc1–mpsc3, and mnsc1–mnsc3. The amount of a reference current of the current-mirror circuit flowing through a path including an NNOS transistor supplied with a reference voltage Vref can be controlled by turning ON and OFF the switches mpsc1–mpsc3, and mnsc1 mnsc3, so that the amount of the output current of the current-mirror circuit can be adjusted.

When the switches mpsc1–mpsc3 and mnsc1–mnsc3 are sequentially turned ON, the amount of the output current of the current-mirror circuit is increased, so that the potential of a node NO1 shown in FIG. 7 rises faster. In contrast, when the switches mpsc1–mpsc3 and mnsc1–mnsc3 are sequentially turned OFF, the amount of the output current of the current-mirror circuit is decreased, so that the potential of the node NO1 rises slower.

The rear stage 64 includes two inverters 64A and 64B connected in parallel. A correction circuit is provided to one of the inverters 64A and 64B, namely, the inverter 64A. The correction circuit is made up of two PMOS transistors mps1 and mps2, and two NMOS transistors mns1 and mns2. Test signals ps1 and ps2 are applied to the gates of the PMOS transistors mps1 and mps2, respectively. Similarly, test signals ns1 and ns2 are applied to the gates of the NMOS transistors mns1 and mns2, respectively.

The PMOS transistors mps1 and mps2 and the NMOS transistors mns1 and mns2 are sequentially turned ON, the output signal DSout can change faster. In contrast, the PMOS transistors mps1 and mps2 and the NMOS transistors mns1 and mns2 are sequentially turned OFF, the output signal DSout can change slower. The PMOS transistors mps1 and mps2 function to adjust the speed at which the output signal DSout rises. The NMOS transistors mns1 and mns2 function to adjust the speed at which the output signal DSout falls. The correction circuit thus configured functions to independently adjust the speed at which an output signal DSout of the input circuit shown in FIG. 7 rises and the speed at which the output signal DSout falls. Thus, it is to be noted that the timings of the rising and falling edges of the output signal DSout can be adjusted independently.

This means that the inclination of the rising edge of the output signal DSout and that of the falling edge thereof can be adjusted independently. For example, it is possible to cause the output signal DSout to rise and fall at the same angle (with the same time). It is thus possible to set the setup and hold times for the rising edge to be equal to the setup and hold times for the falling edge.

Figure 8:
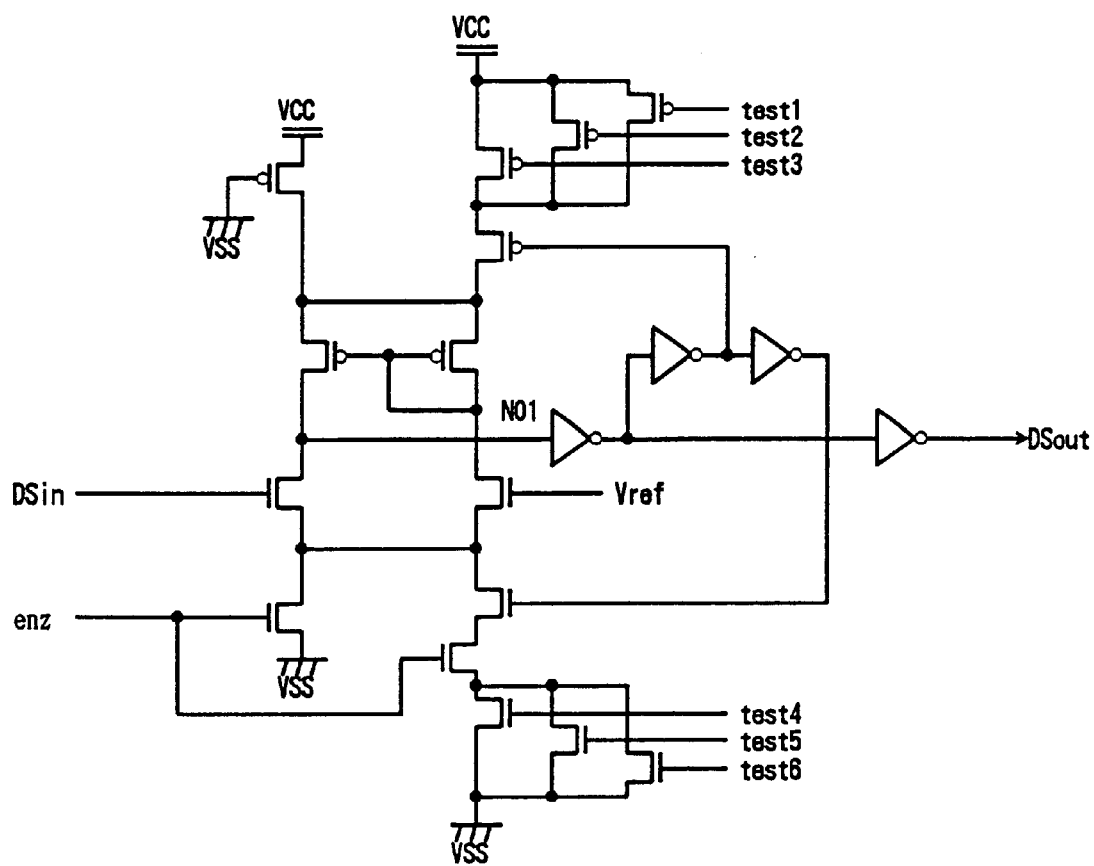
FIG. 8 is a circuit diagram of a variation of a front stage of the input buffer circuit shown in FIG. 7.
Figure 9:
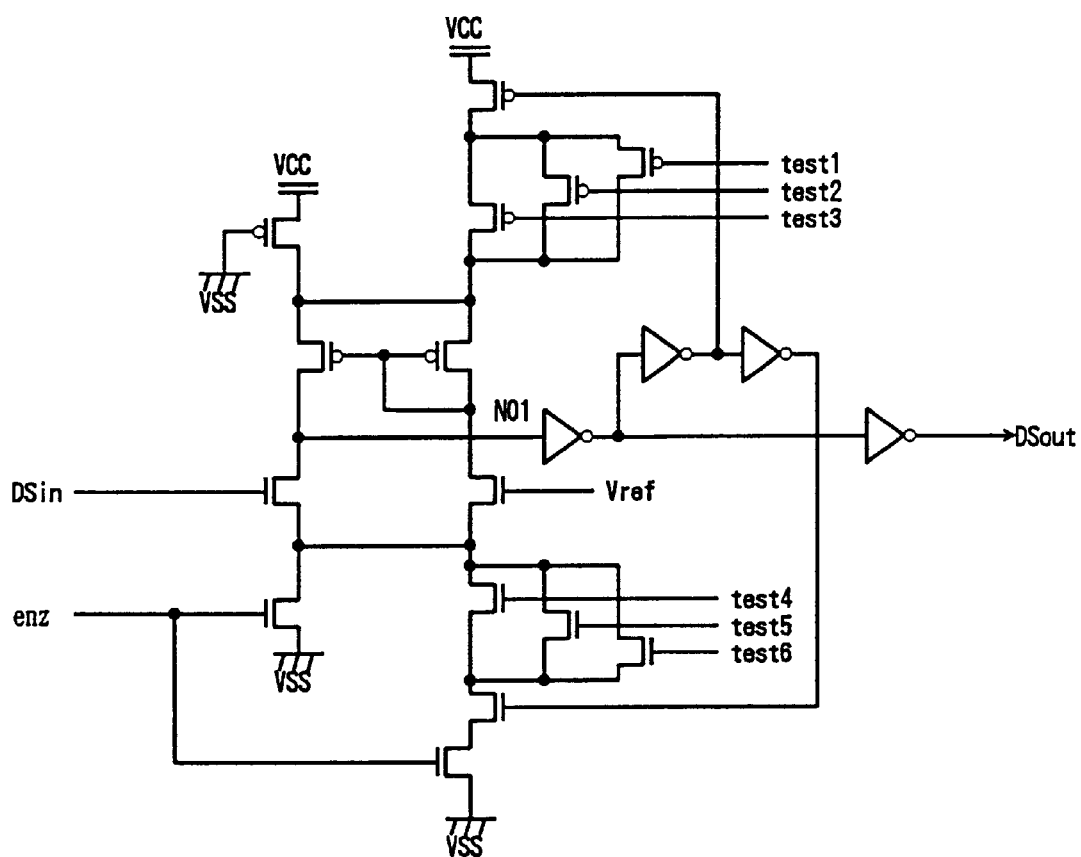
FIG. 9 is a circuit diagram of another variation of the front stage of the input buffer circuit shown in FIG. 7.

FIGS. 8 and 9 respectively show variations of the front stage 62 of the input buffer circuit 16. In the variations shown in FIGS. 8 and 9, PMOS transistors and NMOS transistors are substituted for the switches mpsc1–mpsc3 and mnsc1–mnsc3 shown in FIG. 7. The substitute PMOS and NMOS transistors function to adjust the amount of the reference current and thus the output current thereof.

As shown in FIGS. 8 and 9, test signals test, test2 and test3 are applied to the gates of the PMOS transistors, and test signals test4, test5 and test6 are applied to the gates of the NMOS transistors.

Next, variations of the rear stage 64 of the input buffer circuit 16 will be described. First, a description will be given of the principle of the variations of the rear stage 64.

Figure 10A:
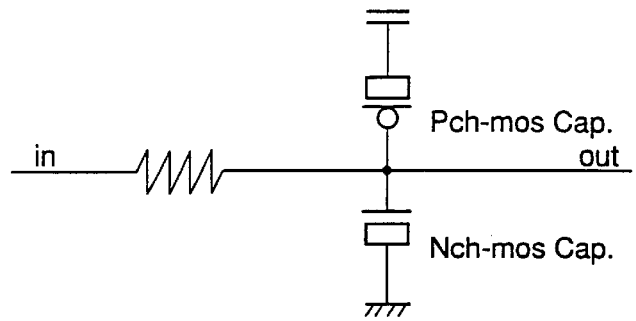
FIGS. 10A, 10B and 10C are diagrams illustrating the principle of a rear stage of the input buffer circuit shown in FIG. 7.

FIG. 10A shows a CR delay circuit including a PMOS transistor and an NMOS transistor. The duty ratio of the output signal of the CR delay circuit can be changed by changing the capacitance of the PMOS transistor and/or the capacitance of the NMOS transistor.

Figure 10B:
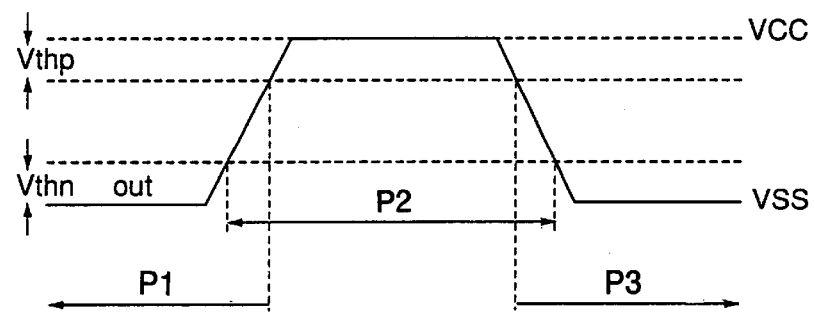

As shown in FIG. 10B, when the potential of the output node exceeds a threshold voltage Vthn of the NMOS transistor, the NMOS transistor is turned ON and thus has a capacitance. When the potential of the output node becomes lower than a threshold voltage Vthp of the PMOS transistor, the PMOS transistor is turned ON and thus has a capacitance. It will be noted that the operation shown in FIG. 10B is observed when the PMOS and NMOS transistors have an identical capacitance. In FIG. 10B, the PMOS transistor is ON during periods P1 and P3, and the NMOS transistor is ON during a period P2.

Figure 10C:
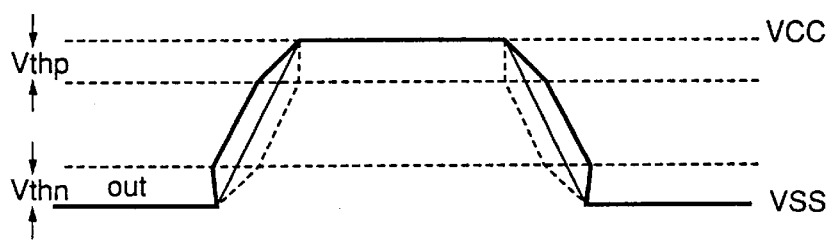
Figure 11A:
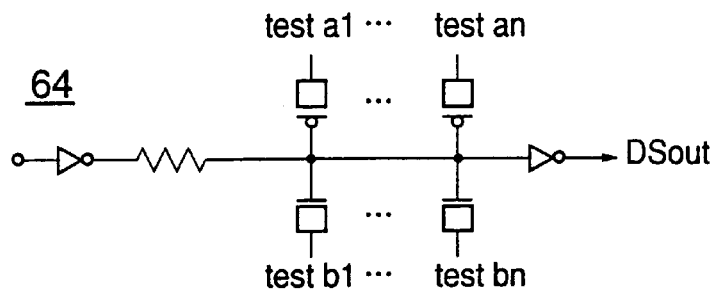
FIGS. 11A, 11B, 11C, 11D and 11E are diagrams of variations of the rear stage of the input buffer circuit shown in FIG. 7.
Figure 11B:
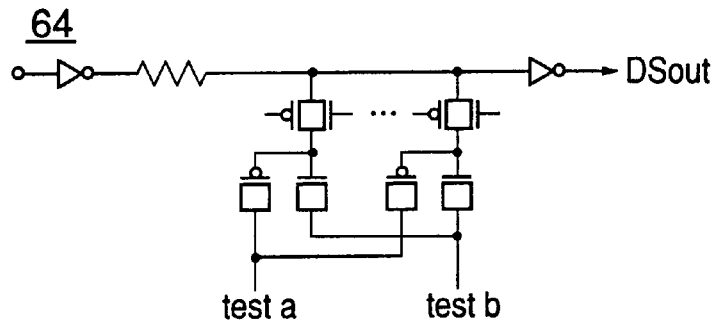
Figure 11C:
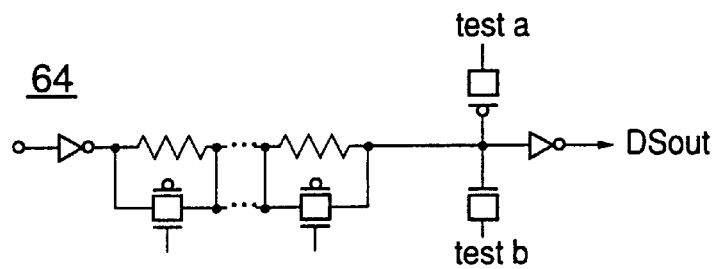
Figure 11D:
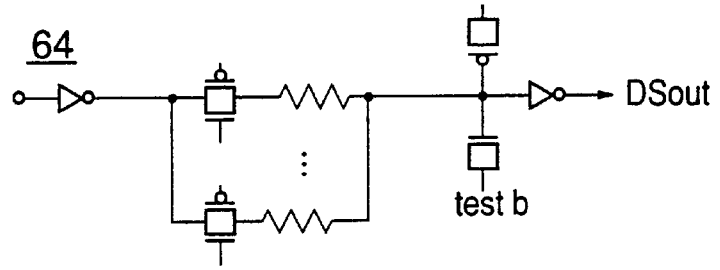
Figure 11E:
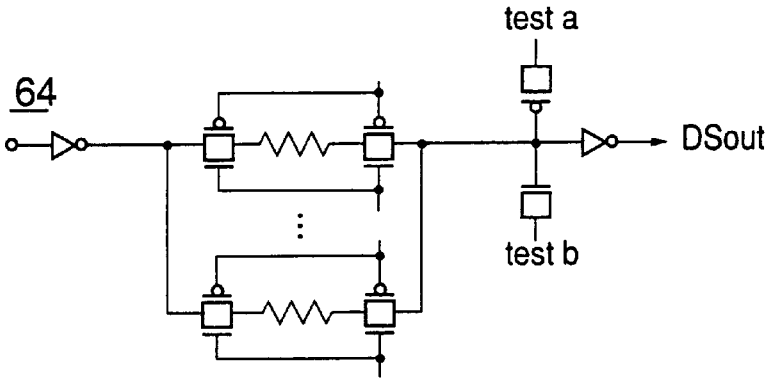
Figure 12A:
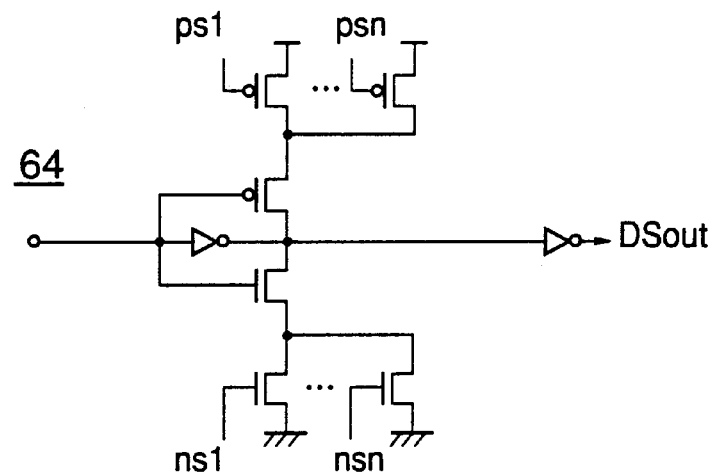
FIGS. 12A, 12B and 12C are diagrams of other variations of the rear stage of the input buffer circuit shown in FIG. 7.
Figure 12B:
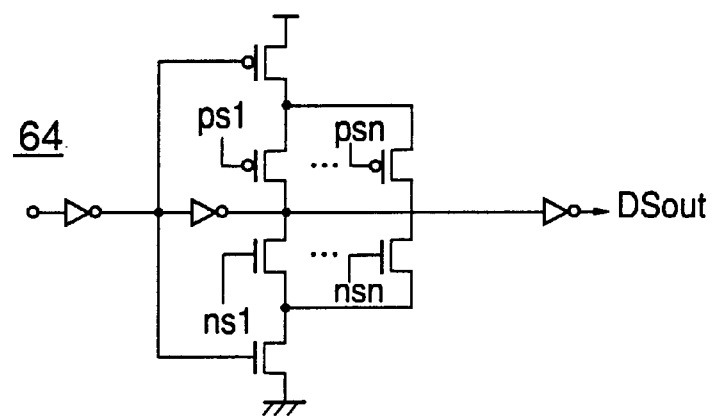
Figure 12C:
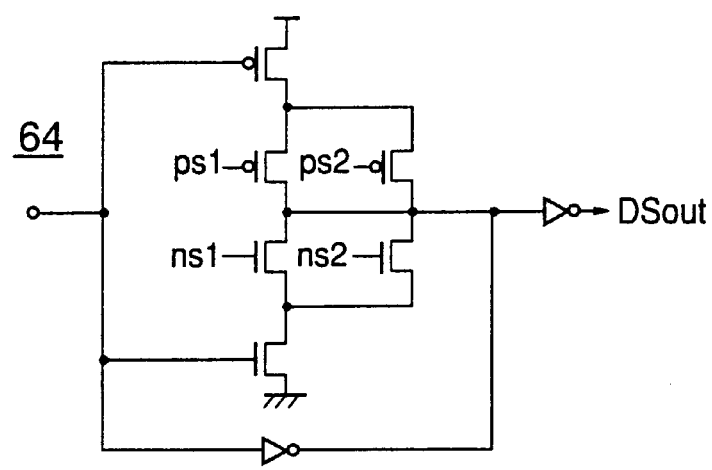

A thick solid line shown in FIG. 10C is observed when the capacitance of the NMOS transistor is increased from the state shown in FIG. 10B and the capacitance of the PMOS transistor is decreased from the state shown in FIG. 10B. A broken line shown in FIG. 10C is observed when the capacitance of the NMOS transistor is decreased from the state shown in FIG. 10B and the capacitance of the PMOS transistor is increased from the state shown in FIG. 10B.

In the case of the thick solid line, the potential of the output node quickly increases to the threshold voltage Vthn because the PMOS transistor has a small capacitance and the NMOS transistor is OFF. In contrast, the potential of the output node slowly decreases to VCC–Vthp because the NMOS transistor has a large capacitance.

In the case of the broken line, the potential of the output node slowly increases to the threshold voltage Vthn because the NMOS transistor is OFF but the PMOS transistor has a large capacitance. In contrast, the potential of the output node quickly decreases to VCC–Vthp because the NMOS transistor has a small capacitance.

Hence, in the case of the thick solid line, the output node reaches the high level quickly and reaches the low level slowly. In the case of the broken line, the output node reaches the high level slowly and reaches the low level quickly.

Hence, it is possible to change the capacitances of the NMOS and PMOS transistors and to thus change the duty ratio of the high level to the low level. FIGS. 11A through 11E and 12A through 12C are circuit diagrams of variations utilizing the above-mentioned principle.

Figure 13:
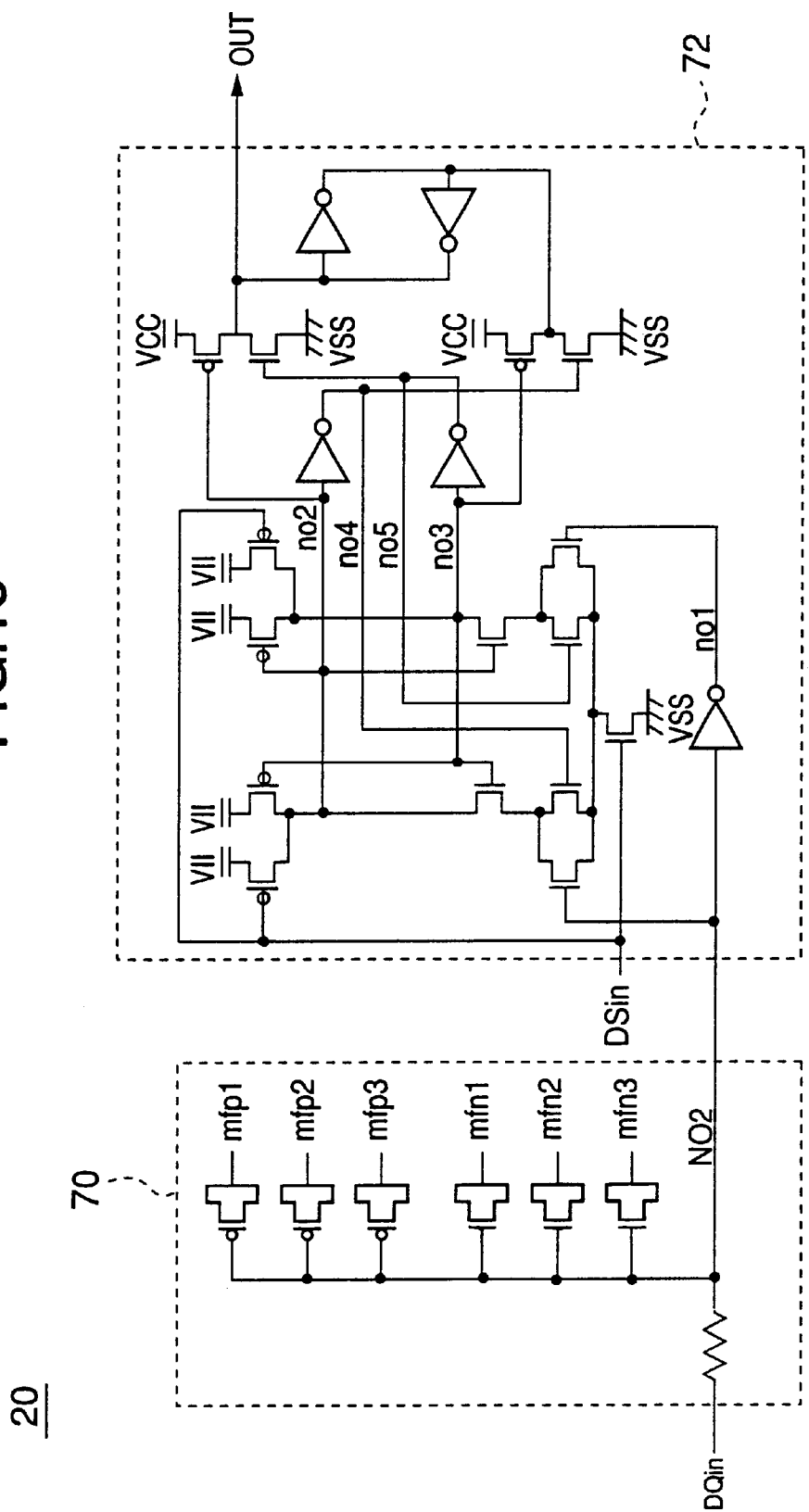
FIG. 13 is a circuit diagram of a latch circuit shown in FIG. 4.
Figure 14A:
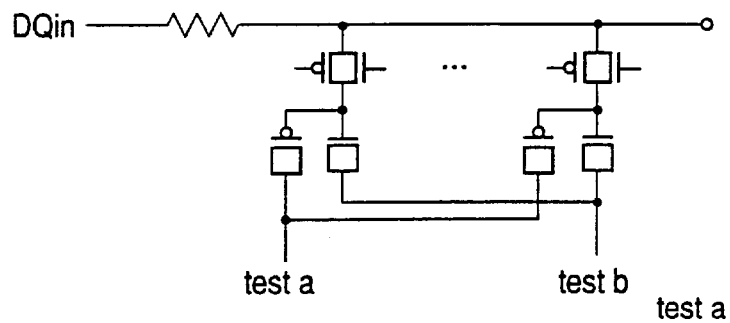
FIGS. 14A, 14B, 14C, 14D and 14E are circuit diagrams of a front stage of the latch a circuit shown in FIG. 13.
Figure 14B:
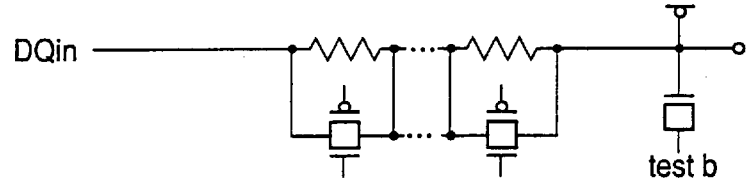
Figure 14C:
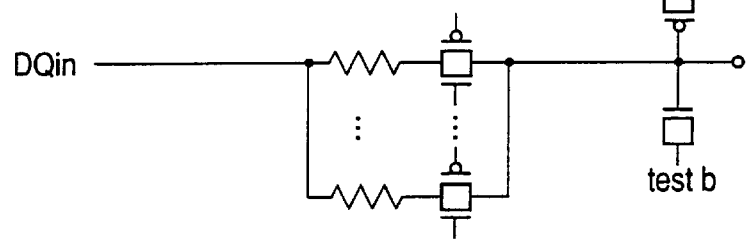
Figure 14D:
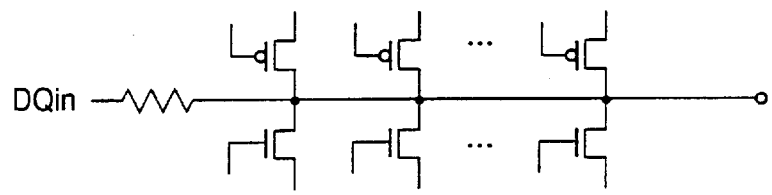
Figure 14E:
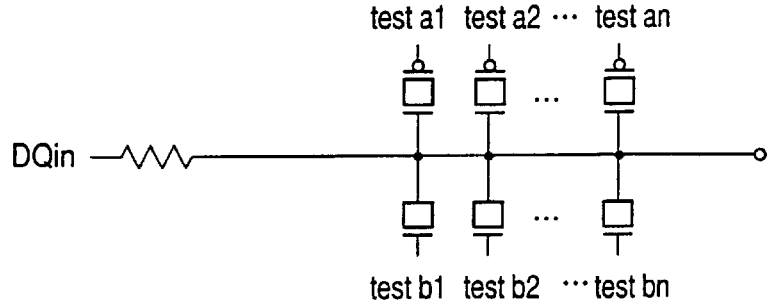

Referring to FIG. 13, there is illustrated the latch circuit 20 shown in FIG. 4. The latch circuit shown in FIG. 13 includes a front stage 70 and a rear stage 72. The front stage 70 includes a CR delay utilizing made up of PMOS and NMOS transistors. The principle of the CR delay has been described with reference to FIGS. 10A through 10C. FIGS. 14A through 14E are circuit diagrams of variations of the front stage 70 of the latch circuit 20. The circuits shown in FIGS. 14A and 14B are designed to adjust the resistance value. The timing of the output signal can be adjusted by changing the capacitances of the NMOS and PMOS transistors of the front stage 70.

Figure 15:
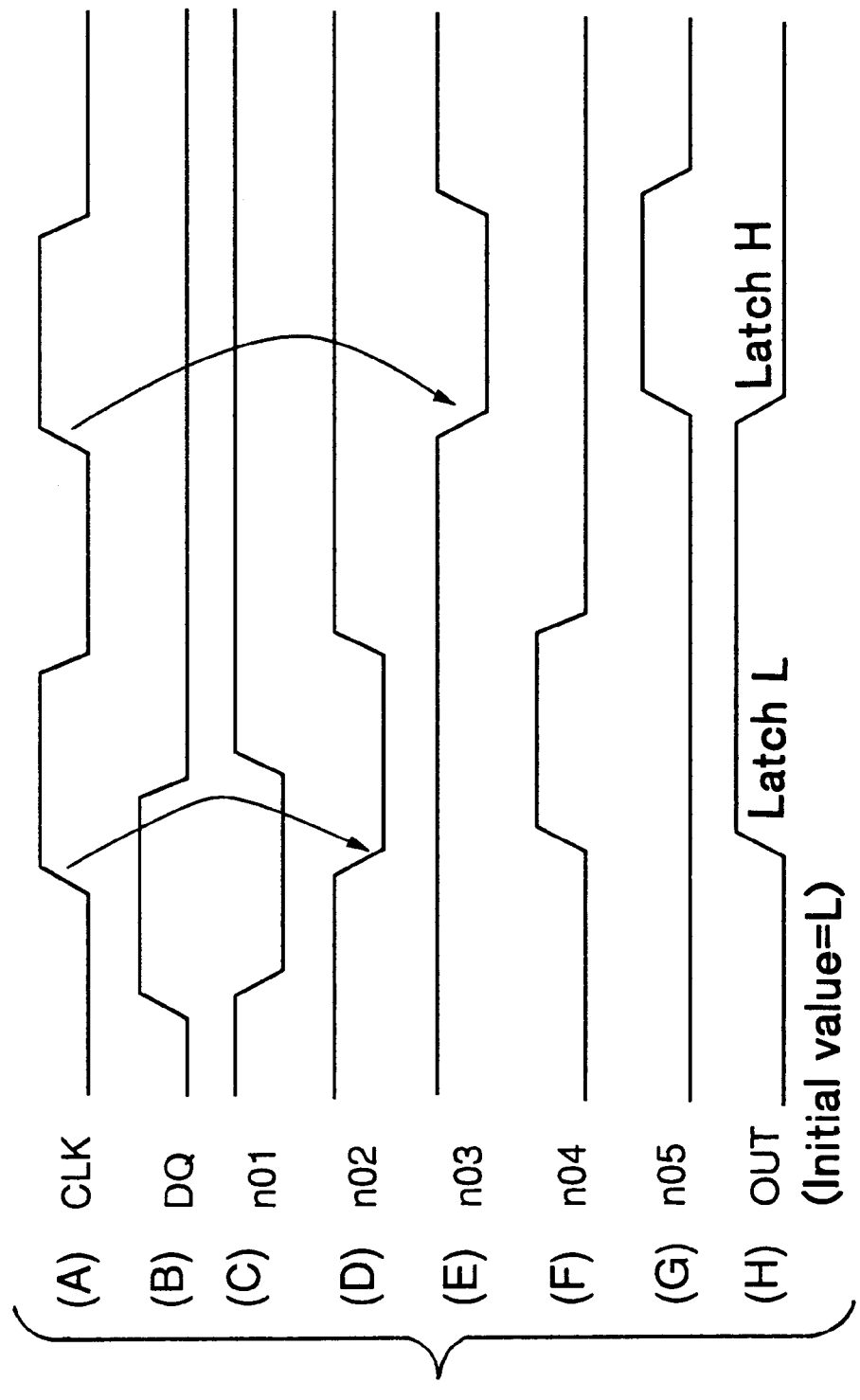
FIG. 15 is a timing chart of an operation of a rear stage of the latch circuit shown in FIG. 13.

The rear stage 72 is supplied with the clock signal DS and the data signal DQ. The operation of the rear sage 72 will be described with reference to FIG. 15. Part (A) of FIG. 15 shows the clock signal CLK, and part (B) thereof shows the data signal DQ. Part (C) of FIG. 15 shows the inverted version of the data signal DQ.

When the clock signal DS shown in part (A) of FIG. 15 is at the low level, the output signal OUT of the rear stage 72 remains at the low level. When the clock signal DS changes from the low level to the high level, the potentials of nodes n02, n03, n04 and n05 shown in FIG. 13 are respectively low, high, high and low because the data signal DQ is high as shown in part (B). Thus, the output signal OUT is switched to the high level.

When the clock signal DS shown in part (A) of FIG. 15 switches from the low level to the high level for the next time, the data signal DQ is low as shown in part (B), and the potentials n02, n03, n04 and n05 are respectively high, low, low and high. Thus, the output signal OUT is switched to the low level.

A description will be given of the test circuit 60. The test circuit 60 is switched to a special test mode in response to a corresponding command. After the entry of the test mode is enabled, the test circuit 60 can outputs the aforementioned test signals.

Figures 16A, 16B:
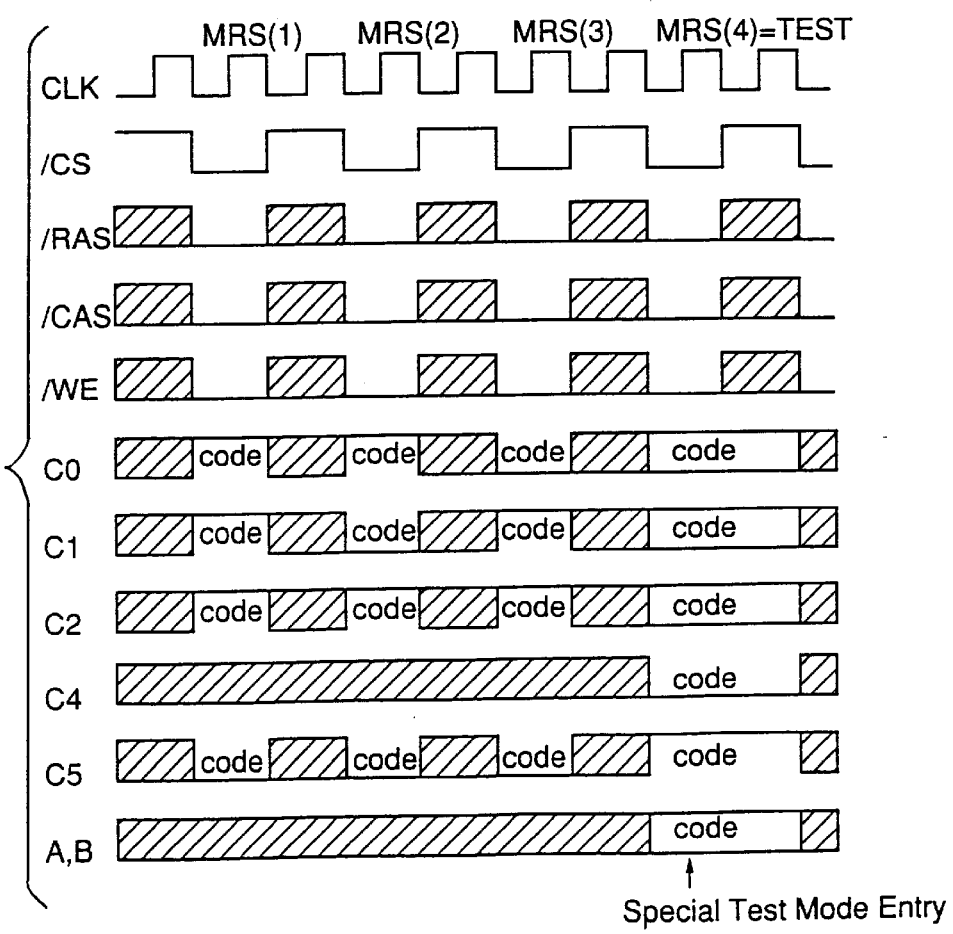
FIGS. 16A and 16B show commands for entry of a test mode.

FIGS. 16A and 16B show a command for entry of the test mode. Three mode register set (MRS) commands of different codes are input, and then the MRS command for entry of the test mode is input. This is intended to avoid a situation that the entry of the test mode is erroneously enabled.

Figure 17:
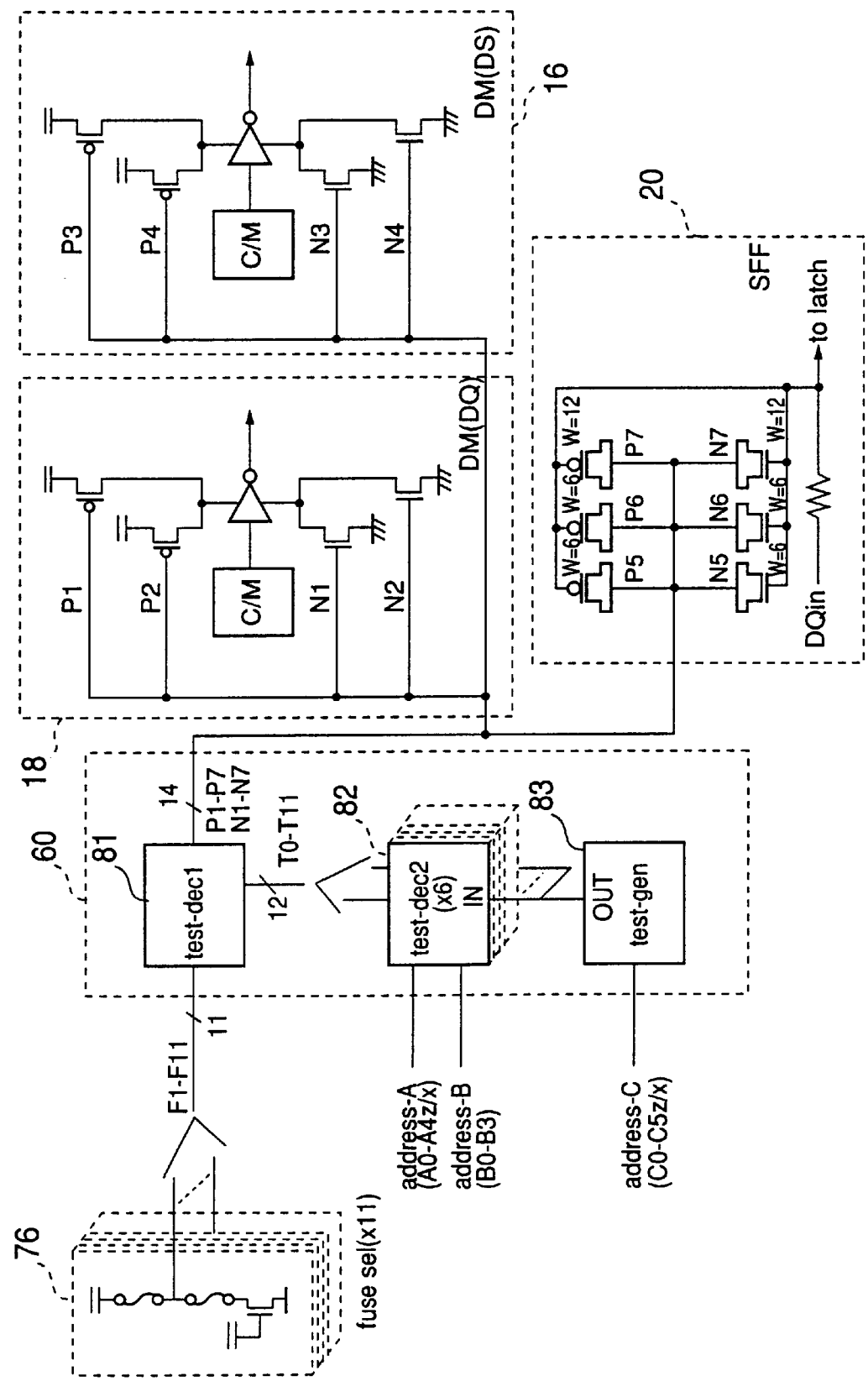
FIG. 17 is a circuit diagram describing a test mode.

The test mode will be described with reference to FIG. 17. The test circuit 60 shown in FIG. 7 includes a test decoder 81, a test decoder 82, and a test generator 83. The test generator 83 receives the mode register set commands MRS shown in FIGS. 16A and 16B, and then outputs a high-level signal to the test decoder 82.

The test decoder 82 is made up of a plurality of decoders, one of which decoders is selected in accordance with an address signal A. The decoder thus selected latches an address signal B. and then outputs it to the test decoder 81. The test decoder 82 decodes the signal supplied from the selected decoder and thus produces the test signals, which are supplied to the input buffer circuits 16 and 18 and the latch circuit 20.

The setting of the test signals can be implemented by fuse cells 76. The fuses of the fuse cells are selectively cut or trimmed. Information thus defined is supplied to the test decoder 81 from the fuse cells 76. It will be noted that the test signals can be produced based on the information defined by the fuse cells 76 or the address externally supplied. The test decoder 81 determines which one of the information from the fuse cells 76 and the external address should be utilized.

Figure 18:
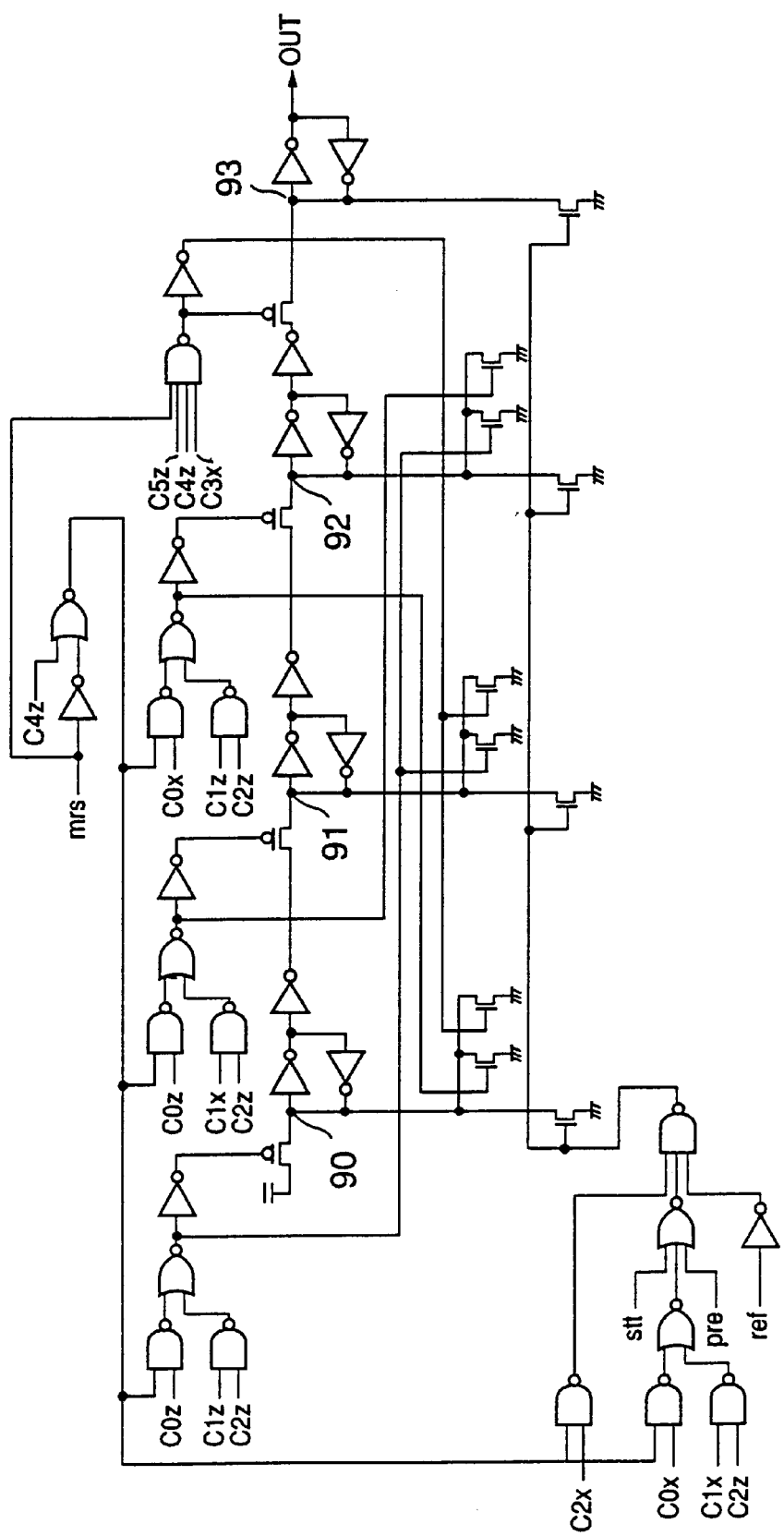
FIG. 18 is a circuit diagram of a test generator shown in FIG. 17.
Figure 19:
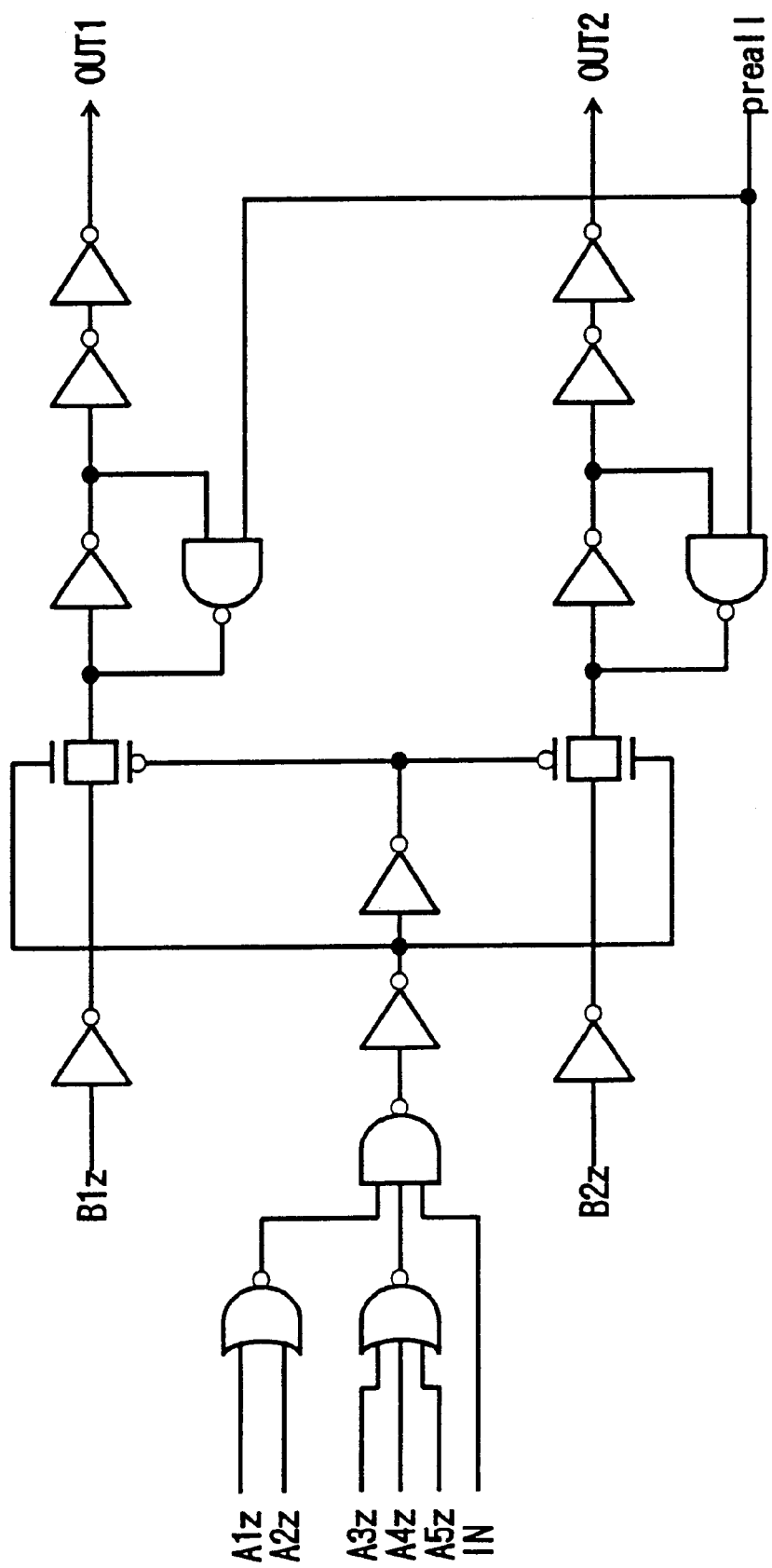
FIG. 19 is a circuit diagram of a test decoder shown in FIG. 17.
Figure 20:
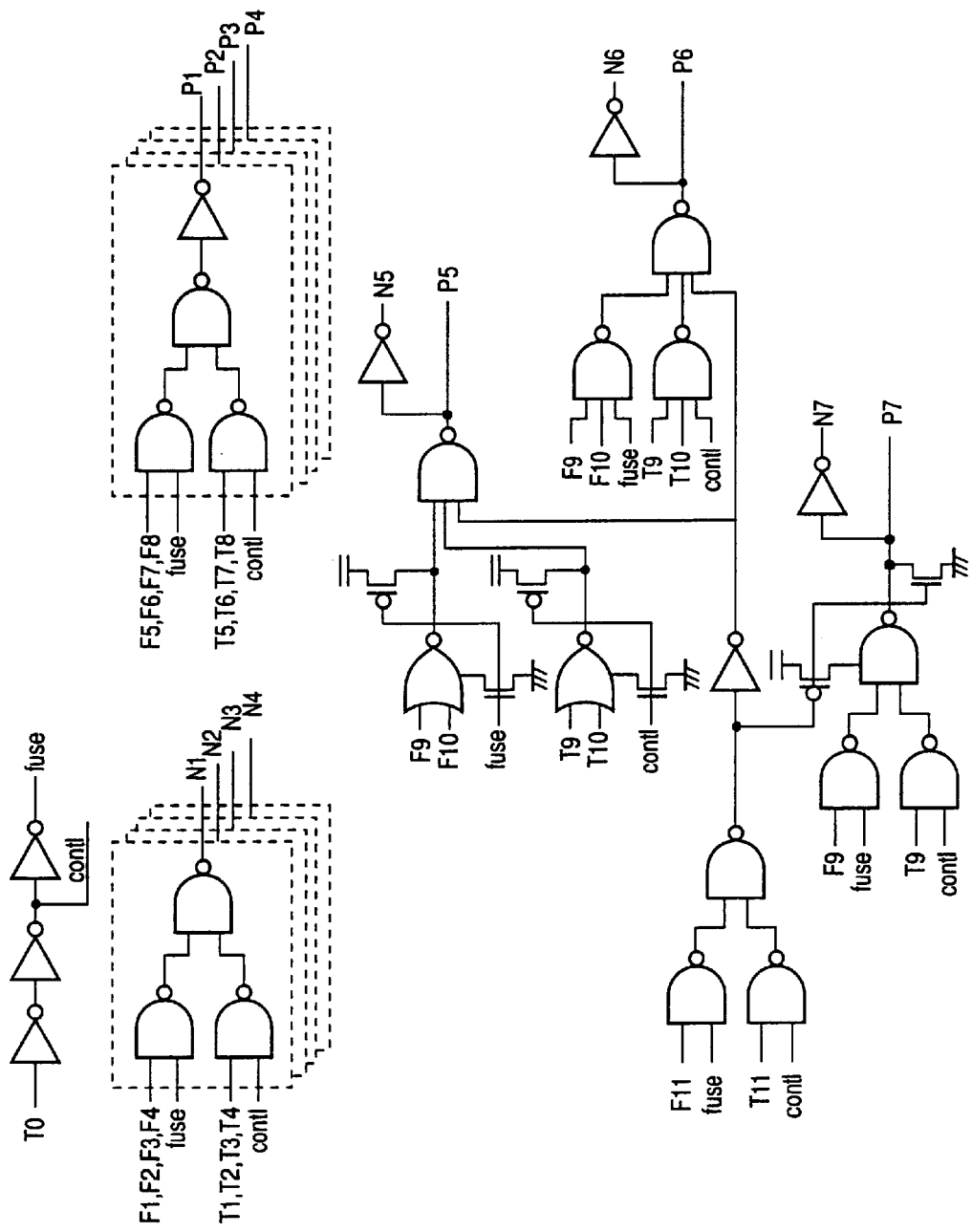
FIG. 20 is a circuit diagram of a test decoder shown in FIG. 17.

A further description will be given, with reference to FIGS. 18, 19 and 20, of the test decoders 81 and 82 and the test generator 83. FIG. 18 is a circuit diagram of the test generator 83, and FIG. 19 is a circuit diagram of each decoder of the test decoder 82. FIG. 20 is a circuit diagram of the test decoder 81.

The test generator 20 shown in FIG. 18 serially receives the commands for entry of the test mode shown in FIGS. 16A and 16B. Then, the potentials of nodes 90, 91, 92 and 93 are sequentially switched to the high level, so that the high-level test signals are supplied to the test decoder 82. A symbol mrs shown in FIG. 18 is a signal, which switches to the high level in response to receipt of the MRS. A symbol slt is a signal, which switches to the high level at the time of power on. A symbol pre is a signal, which switches to the high level in response to receipt of a command for precharge. A symbol ref is a signal, which switches to the high level in response to receipt of a refresh command. A suffix z added to each address signal such as Cz denotes that the signal is in phase with the input address signal. A suffix x added to each address signal such as C0x denotes that the signal has the inverted phase of the input address signal.

One of the decoders forming the test decoder 82 shown in FIG. 19 is selected in accordance with address signals A1z–A5z and a signal IN supplied from the test generator 83. The selected test decoder latches address signals B1z and B2z, and then outputs them. A symbol preall denotes a reset signal.

The test decoder 81 shown in FIG. 20 is supplied from signals F1–F11 supplied from the fuse cells 76, and signals T0–T11 supplied from the test decoder 82, and selects the signals F1–F11 or the signals T1–T11 in accordance with the signal T0. Hence, test signals P1–P7 and N1–N7 output from the test decoder 81 can be controlled by the signals F1–F11 or the signals T1–T11.

A description will be given, with reference to FIG. 21, of a second embodiment of the input circuit provided in the semiconductor device of the present invention. The second embodiment of the input circuit has an arrangement of the input circuit in which a buffer circuit is provided between the input buffer circuit 16 and the latch circuit 20 and another buffer circuit is provided between the input buffer 18 and the latch circuit 20.

Figure 21:
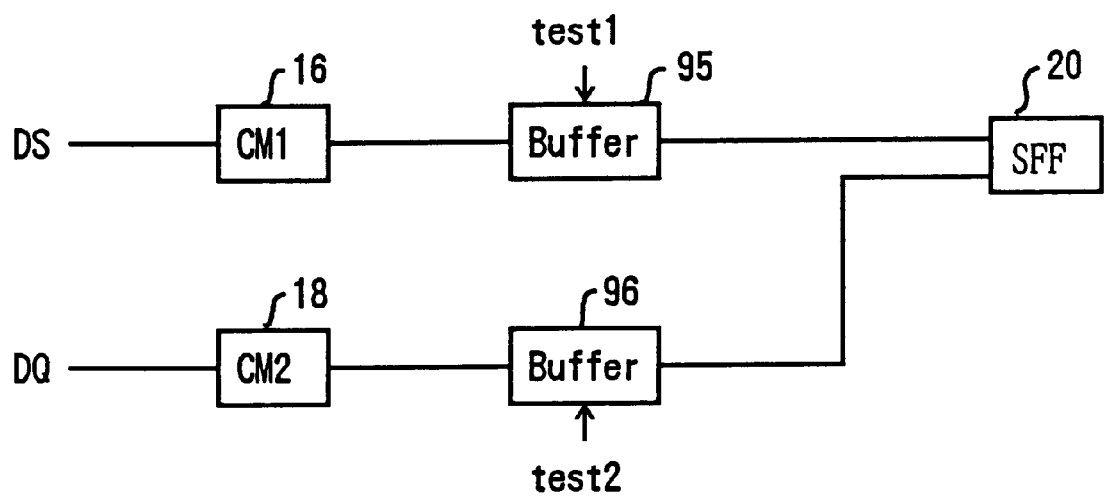
FIG. 21 is a block diagram of a second embodiment of the input circuit provided in the semiconductor device of the present invention.

The arrangement shown in FIG. 21 differs from the input circuit shown in FIG. 4 in that the input buffer shown in FIG. 21 includes buffer circuits 95 and 96. Test signals test1 and test2 are supplied to the buffer circuits 95 and 96, respectively. The timings of the clock signal and the data signal can be adjusted as described previously.

A description will now be given of an adjustment of timing deviations resulting from differences between circuit configurations.

Figure 22:
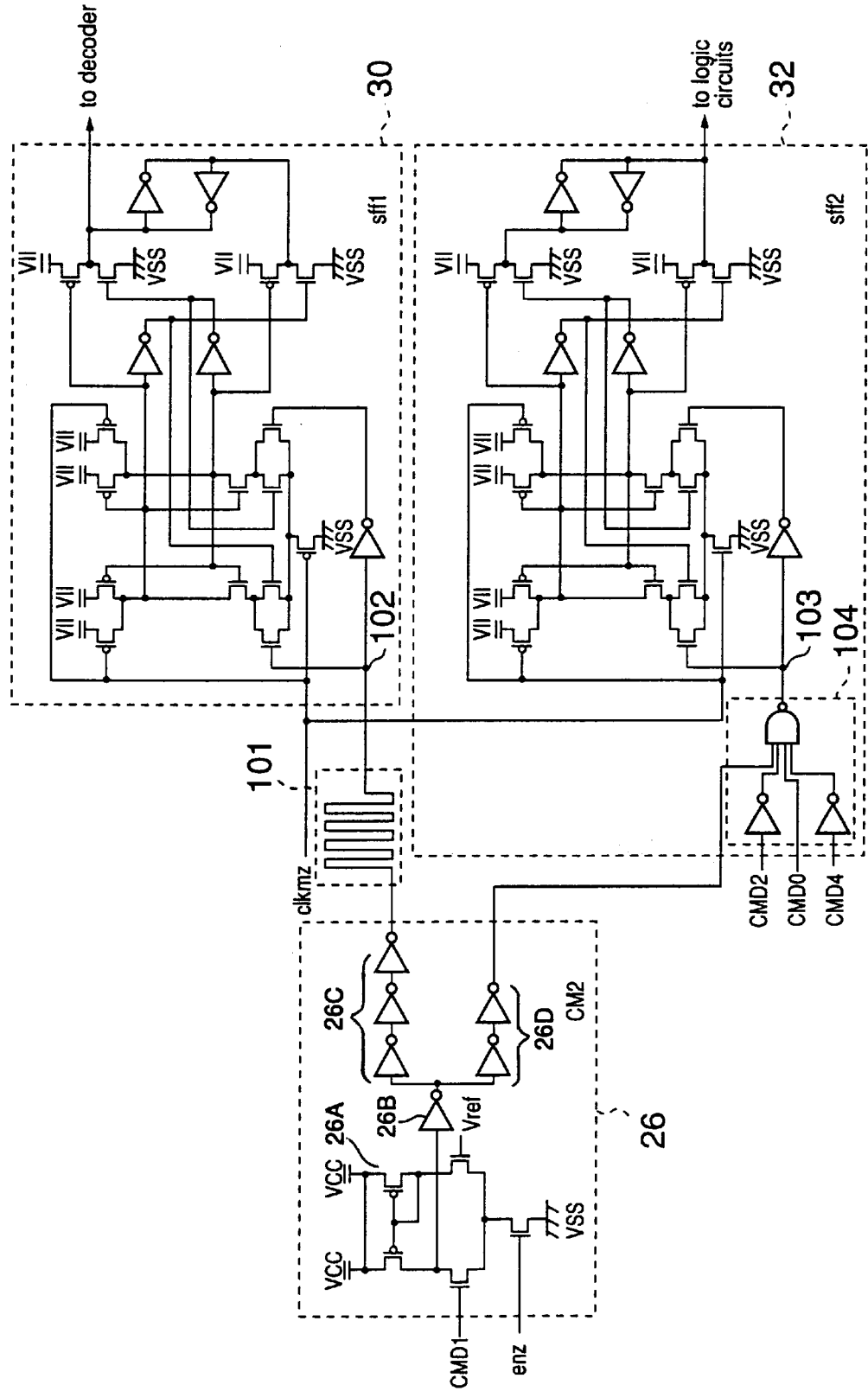
FIG. 22 is a circuit diagram of a third embodiment of the input circuit provided in the semiconductor device of the present invention.

FIG. 22 is a circuit diagram of a third embodiment of the input circuit included in the semiconductor device of the present invention. The input circuit shown in FIG. 22 includes the input buffer circuit 26, and latch circuits 30 and 32.

The input buffer circuit 26 includes a current-mirror circuit 26A provided at the front stage, and receives the data signal CMD1 via the current-mirror circuit 26A. The data signal CMD1 output from the current-mirror circuit 26A passes through an inverter 26B. The data signal CMD1 from the inverter 26B passes through three inverters 26C connected in series, and passes through two inverters 26D connected in series. The data signal CMD1 from the inverters 26C is directed to the latch circuit 30, and the data signal CMD1 from the inverter 26D is directed to the latch circuit 32.

The difference between the number of inverters 26C and the number of inverters 26D is based on logic circuits forming a decoder 104 provided in the latch circuit 32. In FIG. 22, the decoder 104 receives command signals CMD0, CMD2 and CMD4.

There is provided a pattern 101 directed to lengthening the line between the input buffer circuit 26 and the latch circuit 30. The pattern 101, which is a lengthened wiring pattern and acts as a first delay circuit, makes it possible for the timing of the signal at a node 102 to coincide with that of the signal at a node 103. Thus, the latch circuits 30 and 32 can latch the signals at the rising edge of a latch signal clkmz derived from the clock signal, so that the timing difference between the latch circuits 30 and 32 can be adjusted.

FIGS. 23A through 23C, 24A and 24B show variations of the input circuit shown in FIG. 22. In FIGS. 23A through 23C, 24A and 24B, a symbol of a triangular shape denotes a driver.

Figure 23A:
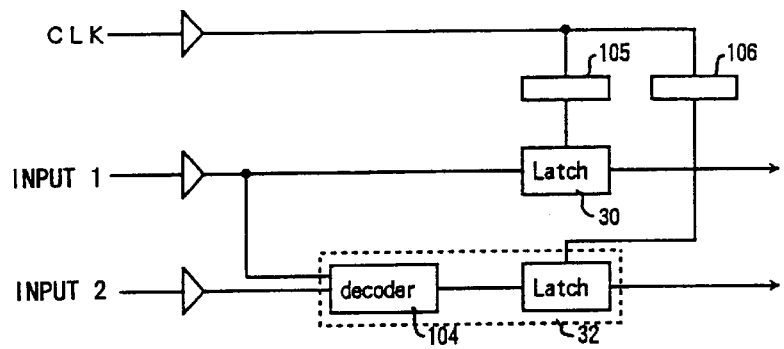
FIGS. 23A, 23B and 23C are block diagrams of variations of the input circuit shown in FIG. 22.

In FIG. 23A, delay circuits 105 and 106, which act as second delay circuits with respect to the first delay circuit 101, are provided before the latch signal clkmz derived from the clock signal CLK is supplied to the latch circuits 30 and 32. The delayed latch signals clkmz make it possible to definitely latch inputs 1 and 2 in the latch circuits 30 and 32 after decoding.

Figure 23B:
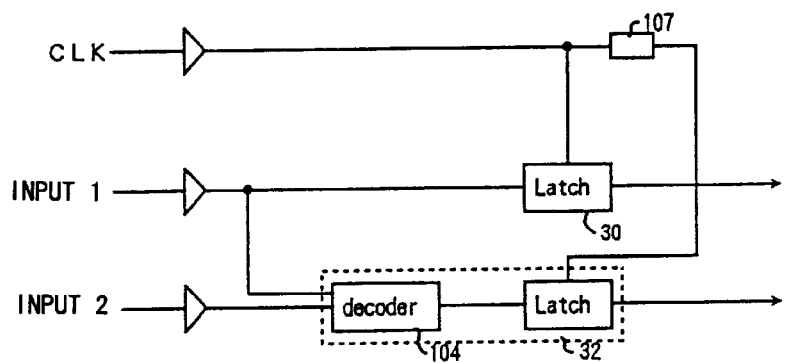

In FIG. 23B, a delay circuit 107 is provided before the latch signal clkmz is supplied to the latch circuit 32. The delayed latch signal clkmz makes it possible for the latch circuit 32 to definitely latch the input signal after decoding.

Figure 23C:
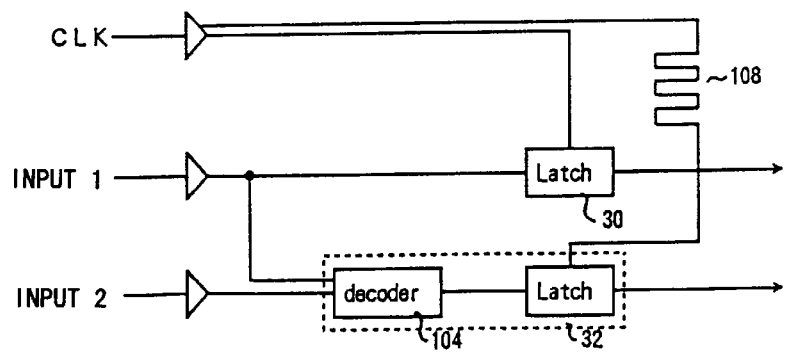

In FIG. 23C, a delay circuit 108 having a long wiring pattern is provided before the latch signal clkmz is supplied to the latch circuit 32. Two lines extend from the driver that receives the clock signal CLK. One of the two lines is connected to the latch circuit 30, and the other line is connected to the delay circuit 108. The delayed latch signal clkmz makes it possible for the latch circuit 32 to definitely latch the input signal after decoding.

Figure 24A:
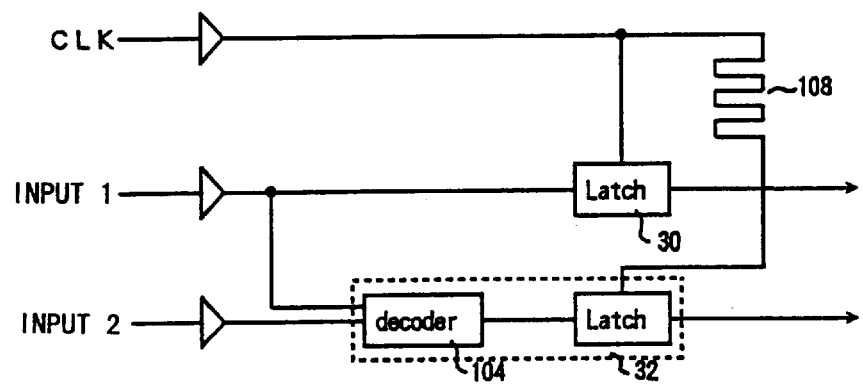
FIGS. 24A and 24B are block diagrams of other variations of the input circuit shown in FIG. 22.

A circuit shown in FIG. 24A differs from that shown in FIG. 23C in that the former circuit does not have two lines extending from the driver receiving the clock CLK but has only one line. The delayed latch signal clkmz makes it possible for the latch circuit 32 to definitely latch the input signal after decoding.

Figure 24B:
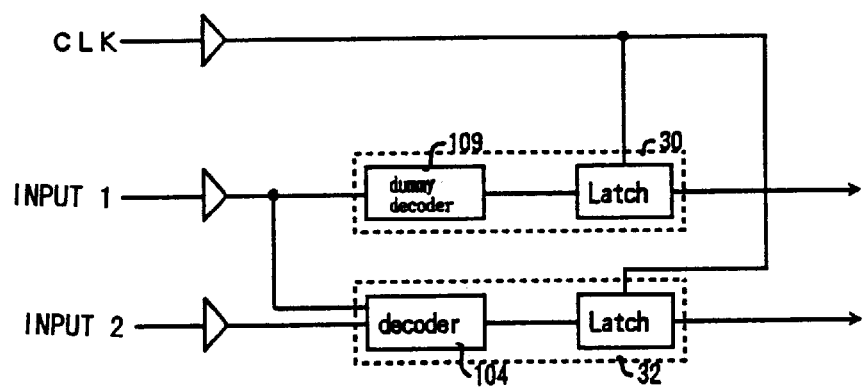

A circuit shown in FIG. 24B has a dummy decoder 109 provided at the front stage of the latch circuit 30. The dummy decoder 109 delays the input signal taking into consideration the delay caused by the decoder 104. Thus, the input signals can be simultaneously latched in the latch circuits 30 and 32.

Figure 25:
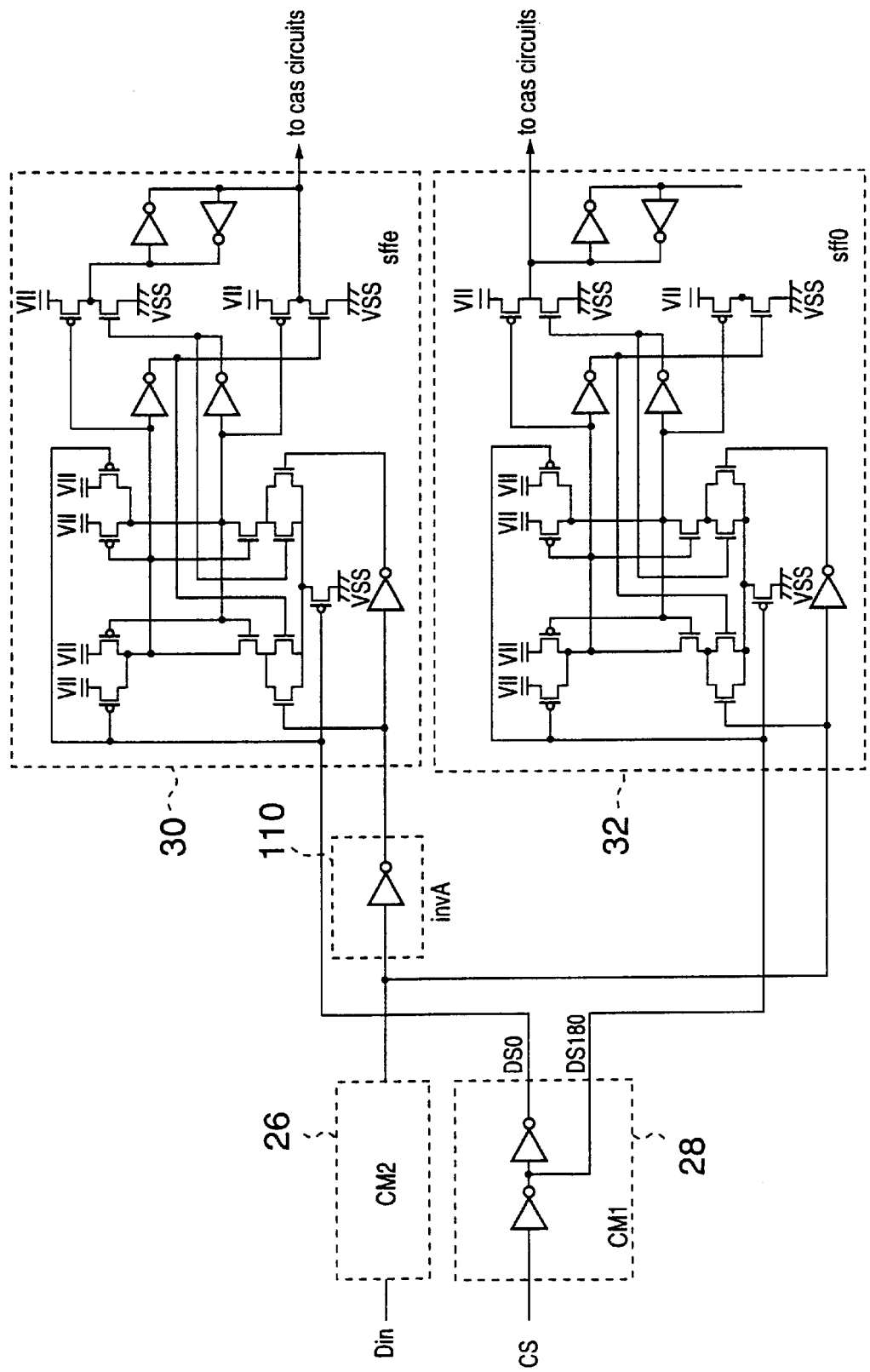
FIG. 25 is a circuit diagram of a fourth embodiment of the input circuit included in the semiconductor device of the present invention.

FIG. 25 is a circuit diagram of a fourth embodiment of the input circuit provided in the semiconductor device of the present invention. The clock signal DS0 lags behind the clock signal DS180 by a time equal to the delay of one inverter. Hence, an inverter 110 is provided in order to delay the data signal output from the input buffer circuit 26 to the latch circuit 30.

Thus, the data signal supplied to the latch circuit 30 is pulled in phase with the clock signal DS0, so that the timing adjustment can be achieved.

Figure 26A:
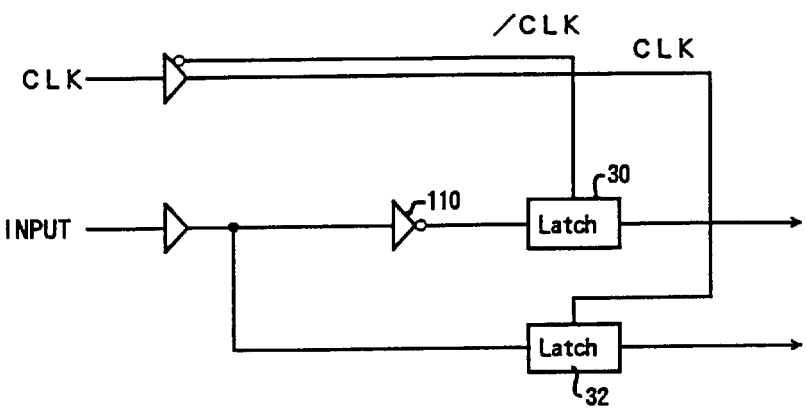
FIGS. 26A, 26B and 26C are block diagrams of variations of the input circuit shown in FIG. 25.
Figure 26B:
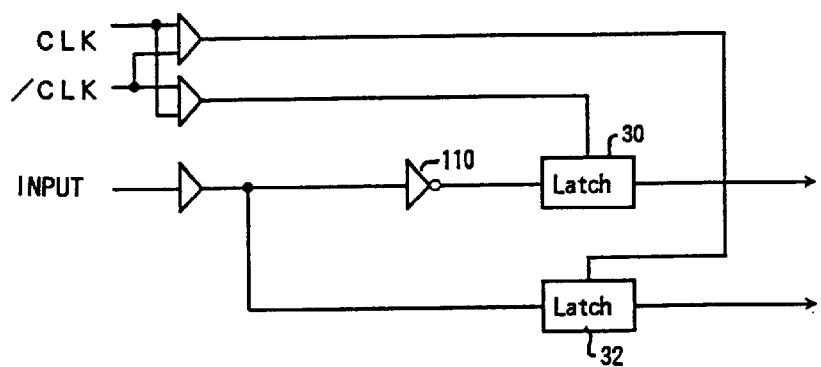
Figure 26C:
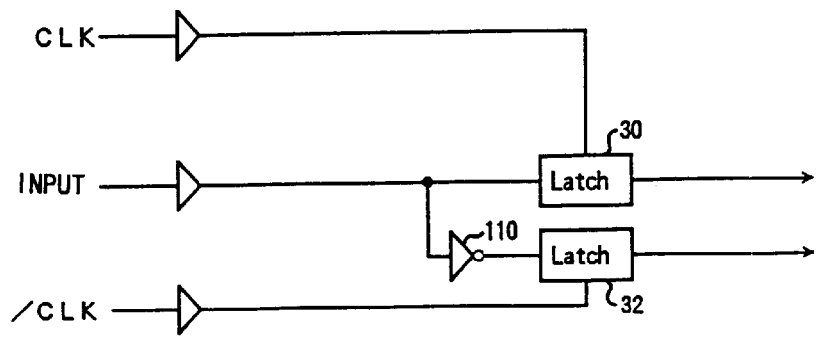

FIGS. 26A, 26B and 26C respectively show variations of the input circuit shown in FIG. 25, The ways to supply the clock signal DS0 (CLK) and DS180 (/CLK) shown in FIGS. 26A, 26B and 26C are different from the previously described ways. However, the effects of the circuit shown in FIGS. 26A, 26B and 26C are the same as those of the previously described input circuits.

Figure 27:
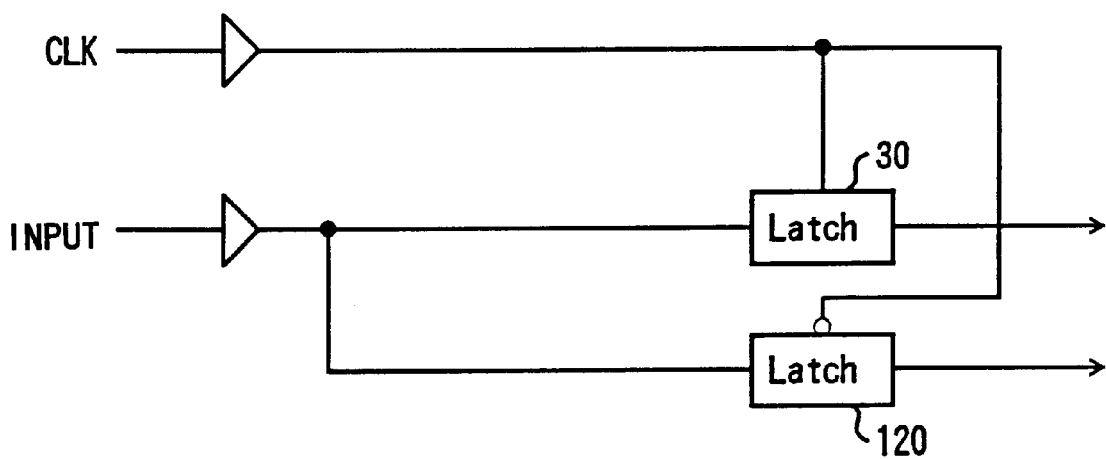
FIG. 27 is a block diagram of a fifth embodiment of the input circuit included in the semiconductor device of the present invention.

FIG. 27 shows a fifth embodiment of the input circuit included in the semiconductor device of the invention. The clock signal which is in phase with the clock signal output from the input buffer circuit 28 is supplied to the latch circuit 30 and a latch circuit 120. The latch circuit 120 has an inverted logic of the latch circuit 30. Thus, there is no need to generate the clock signals DS0 and DS180 by means of inverters, so that the problems resulting from the use of inverters can be avoided.

Figure 28:
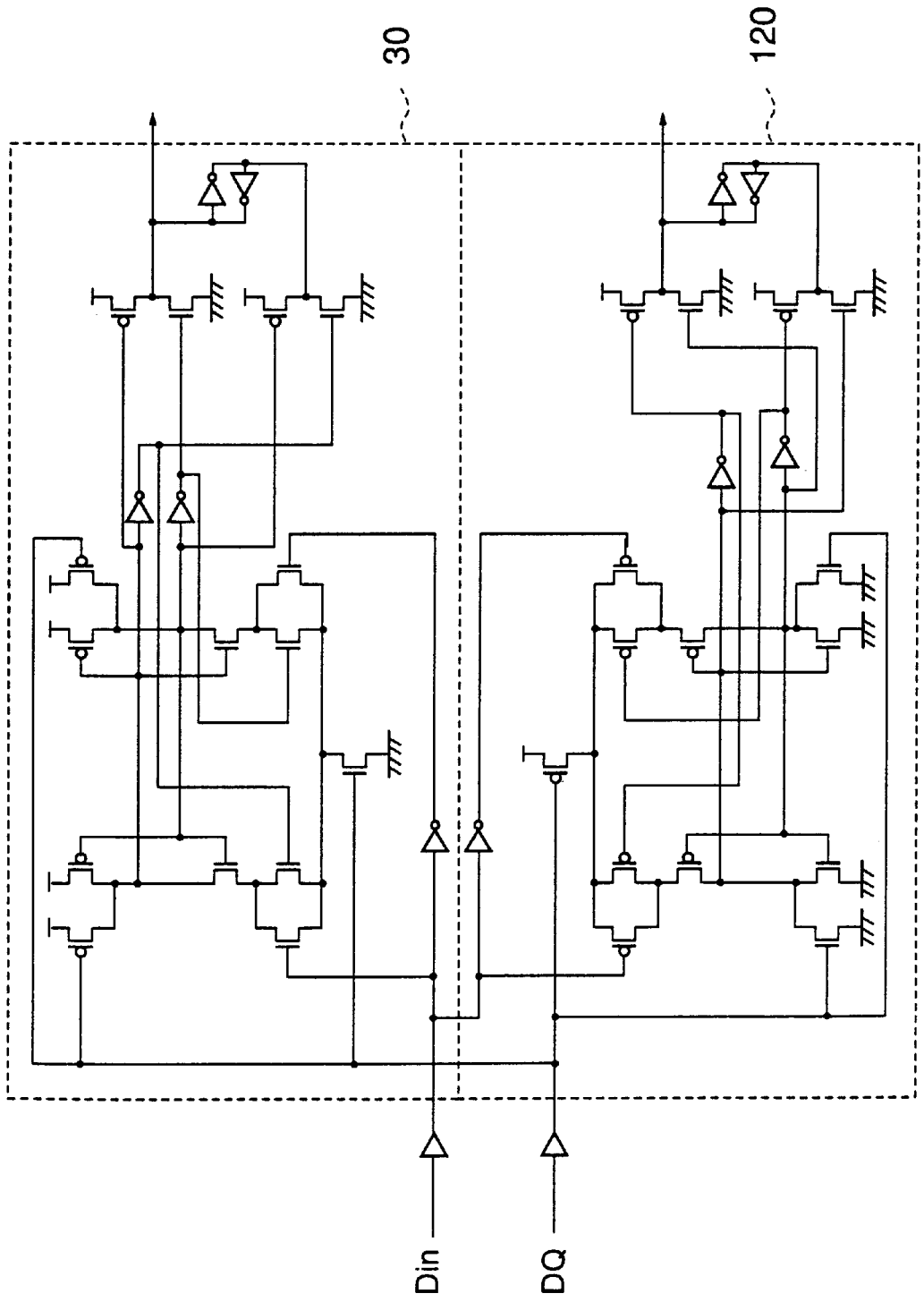
FIG. 28 is a circuit diagram of latch circuits having an inverted logic relationship.

FIG. 28 is a circuit diagram of the latch circuit 120. The latch circuit 120 has the inverted logic of the latch circuit 30. The latch circuits 30 and 120 that receive the clock signals in phase operate as if the clock signals DS0 and DS180 are supplied thereto.

The present invention is not limited to the specifically disclosed embodiments, and variations and modifications may be made without departing from the scope of the invention.

What is claimed is:

1. A semiconductor integrated circuit device comprising:
   a clock buffer circuit receiving a clock signal;
   a data buffer circuit receiving a data signal;
   an output circuit outputting the data signal from the data buffer circuit in accordance with the clock signal from the clock buffer circuit; and
   an adjustment circuit adjusting timings of the clock signal and the data signals by controlling the clock buffer circuit and the data buffer circuit.

2. The semiconductor integrated circuit device as claimed in claim 1, wherein the adjustment circuit adjusts amounts of reference currents respectively flowing in current-mirror circuits included in the clock buffer circuit and the data buffer circuit.

3. The semiconductor integrated circuit device as claimed in claim 1, wherein the adjustment circuit adjusts potentials of drive circuits respectively included in the clock buffer circuit and the data buffer circuit.

4. The semiconductor integrated circuit device as claimed in claim 1, wherein the adjustment circuit includes a CR delay circuit implemented by a PMOS transistor and an NMOS transistor.

5. The semiconductor integrated circuit device as claimed in claim 1, further comprising a first buffer circuit provided between the clock buffer circuit and the output circuit, and a second buffer circuit provided between the data buffer circuit and the output circuit,
   wherein the first and second buffer circuits adjust the timings of the clock signal and the data signal.

* * * * *